(12) United States Patent
Kim et al.

(10) Patent No.: US 12,034,026 B2
(45) Date of Patent: Jul. 9, 2024

(54) IMAGE SENSOR AND METHOD OF MANUFACTURING THE SAME

(71) Applicant: SAMSUNG ELECTRONICS CO., LTD., Suwon-si (KR)

(72) Inventors: Hyuncheol Kim, Suwon-si (KR); Kyungho Lee, Suwon-si (KR); Kazunori Kakehi, Suwon-si (KR); Doosik Seol, Suwon-si (KR); Kyungduck Lee, Hwaseong-si (KR); Taesub Jung, Hwaseong-si (KR); Masato Fujita, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 384 days.

(21) Appl. No.: 17/465,217

(22) Filed: Sep. 2, 2021

(65) Prior Publication Data

US 2022/0190007 A1    Jun. 16, 2022

(30) Foreign Application Priority Data

Dec. 16, 2020    (KR) .................. 10-2020-0176126

(51) Int. Cl.
*H01L 27/146*    (2006.01)
(52) U.S. Cl.
CPC .... *H01L 27/1463* (2013.01); *H01L 27/14621* (2013.01); *H01L 27/14627* (2013.01); *H01L 27/1464* (2013.01); *H01L 27/14645* (2013.01); *H01L 27/14683* (2013.01)

(58) Field of Classification Search
None
See application file for complete search history.

(56) References Cited

U.S. PATENT DOCUMENTS

| 9,876,044 | B2 | 1/2018 | Lee et al. |
| 10,367,029 | B2 | 7/2019 | Lee et al. |
| 10,431,619 | B2 | 10/2019 | Masagaki et al. |
| 10,700,114 | B2 | 6/2020 | Honda et al. |
| 10,998,365 | B2 | 5/2021 | Pyo et al. |
| 2016/0218138 | A1 | 7/2016 | Oishi |
| 2017/0047363 | A1 | 2/2017 | Choi et al. |
| 2019/0043901 | A1* | 2/2019 | Honda .............. H01L 27/14689 |

FOREIGN PATENT DOCUMENTS

JP    2018-201015 A    12/2018

* cited by examiner

*Primary Examiner* — Bo B Jang
(74) *Attorney, Agent, or Firm* — Muir Patent Law, PLLC

(57) ABSTRACT

An image sensor includes a substrate having first and second surfaces, pixel regions arranged in a direction parallel to the first surface, first and second photodiodes isolated from each other in each of the pixel regions, a first device isolation film between the pixel regions, a pair of second device isolation films between the first and second photodiodes and extending from the first device isolation film, a doped layer adjacent to the pair of second device isolation films and extending from the second surface to a predetermined depth and spaced apart from the first surface, the doped layer being isolated from the first device isolation film, and a barrier area between the pair of second device isolation films and having a potential greater than a potential of a portion of the substrate adjacent to the barrier area.

20 Claims, 32 Drawing Sheets

IMAGE SENSOR AND METHOD OF MANUFACTURING THE SAME

CROSS TO REFERENCE TO RELATED APPLICATION

Korean Patent Application No. 10-2020-0176126 filed on Dec. 16, 2020, in the Korean Intellectual Property Office, and entitled: "Image Sensor and Method of Manufacturing the Same," is incorporated by reference herein in its entirety.

BACKGROUND

1. Field

Example embodiments of the present disclosure relate to an image sensor and a method of manufacturing the same.

2. Description of the Related Art

An image sensor is a semiconductor device which may convert an optical image into an electrical signal. Among various image sensors, a complementary metal oxide semiconductor (CMOS) type image sensor is referred to as a CMOS image sensor (CIS). A CIS may include a plurality of pixel regions, and each of the pixel regions may include at least one photodiode (PD) for converting incident light into an electrical signal. A CIS having a structure including two photodiodes in a single pixel region may have improved autofocusing performance.

SUMMARY

According to an example embodiment of the present disclosure, an image sensor comprises a substrate including a first surface and a second surface, the first surface and the second surface being spaced apart from each other in a first direction; pixel regions in the substrate, the pixel regions being arranged in a direction parallel to the first surface; a first photodiode and a second photodiode in the substrate, the first photodiode and the second photodiode corresponding to each of the pixel regions and being isolated from each other in a second direction perpendicular to the first direction; a first device isolation film between the pixel regions; a pair of second device isolation films between the first photodiode and the second photodiode in at least one of the pixel regions, the pair of second device isolation films extending from the first device isolation film to a region between the first photodiode and the second photodiode in a third direction perpendicular to the first direction and the second direction; a doped layer in the substrate and adjacent to the pair of second device isolation films, the doped layer extending in the first direction from the second surface of the substrate to a predetermined depth spaced apart from the first surface of the substrate, and the doped layer being isolated from the first device isolation film in the third direction; and a barrier area between the pair of second device isolation films, the barrier area having a potential greater than a potential of a portion of the substrate adjacent to the barrier area.

According to an example embodiment of the present disclosure, a method of manufacturing an image sensor includes obtaining a substrate with pixel regions; forming a first trench that extends in a first direction perpendicular to an upper surface of the substrate, such that the first trench isolates the pixel regions from each other; forming second trenches in the first direction and connected to the first trench, such that the second trenches are between a first photodiode and a second photodiode corresponding to each of the pixel regions, the first photodiode and the second photodiode being isolated from each other in a second direction perpendicular to the first direction; implanting impurities into the substrate through the second trenches by irradiating a beam incident on a surface perpendicular to the second direction at a predetermined angle with the first direction, based on a predetermined depth to which impurities are implanted into the substrate in the first direction; and after implanting the impurities, forming a first device isolation film in the first trench and forming a second device isolation film in the second trenches.

According to an example embodiment of the present disclosure, a method of manufacturing an image sensor includes forming first trenches in a first direction perpendicular to an upper surface of a substrate, such that the first trenches isolate pixel regions from each other; forming second trenches connected to the first trenches, such that the second trenches extend in the first direction between a first photodiode and a second photodiode according to each of the pixel regions, the first photodiode and the second photodiode being isolated from each other in a second direction perpendicular to the first direction; implanting impurities into the substrate through the second trenches using a beam incident perpendicularly to the second direction at a predetermined angle with the first direction so as to intersect with the first direction; and forming a barrier area in the substrate between the first photodiode and the second photodiode, such that a position of the barrier area and a maximum potential of the barrier area are determined by the predetermined angle.

BRIEF DESCRIPTION OF DRAWINGS

Features will become apparent to those of skill in the art by describing in detail exemplary embodiments with reference to the attached drawings, in which:

FIGS. 16A to 16C are diagrams illustrating a result of simulation of an image sensor according to an example embodiment of the present disclosure;

DETAILED DESCRIPTION

Figure 1:
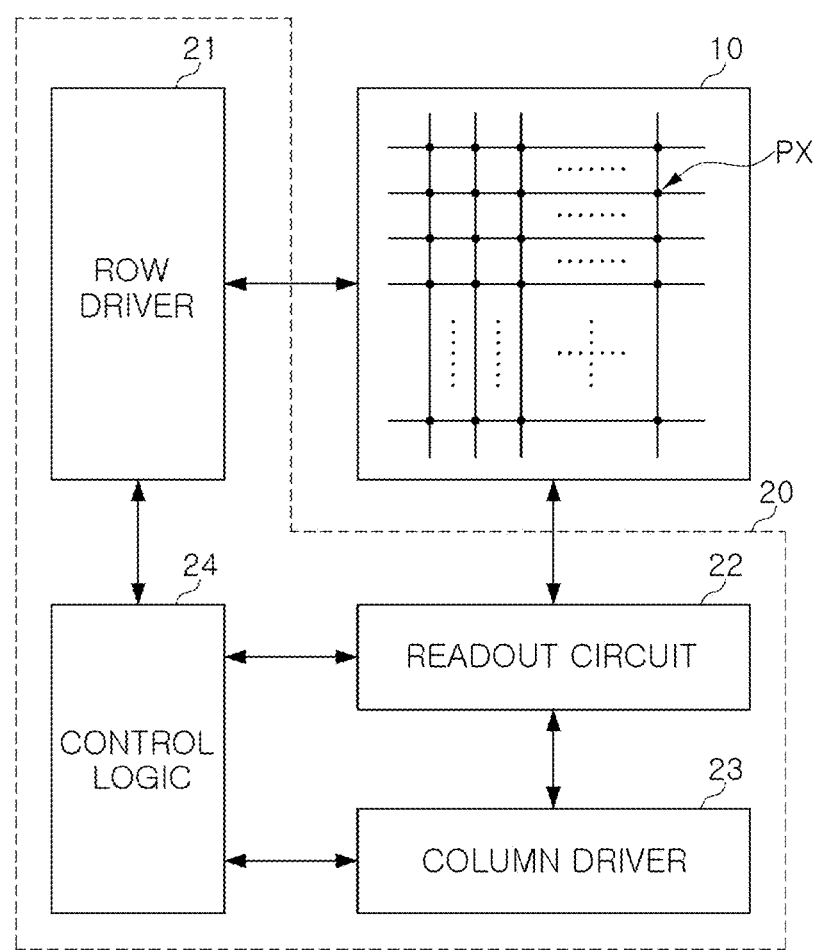
FIG. 1 is a block diagram of an image sensor according to an example embodiment of the present disclosure.

FIG. 1 is a block diagram illustrating an image sensor according to an example embodiment.

Referring to FIG. 1, an image sensor 1 in an example embodiment may include a pixel array 10 and a logic circuit 20.

The pixel array 10 may include a plurality of unit pixels PX disposed in array form along a plurality of rows and a plurality of columns. Each of the unit pixels PX may include at least one photoelectric conversion device configured to generate electric charges in response to light, and a pixel circuit configured to generate a pixel signal corresponding to electric charges generated by the photoelectric conversion device.

The photoelectric conversion device may include a photodiode formed of a semiconductor material, and/or an organic photodiode formed of an organic material. In an example embodiment, each of the unit pixels PX may include two or more photoelectric conversion devices, and the two or more photoelectric conversion devices included in a single unit pixel PX may generate electric charges by receiving light of different colors. For example, each of the unit pixels PX may include a first photodiode and a second photodiode, and the first photodiode and the second photodiode may generate electric charges by receiving light in different wavelength bands.

According to example embodiments, the pixel circuit may include a transfer transistor, a drive transistor, a select transistor, and a reset transistor. When each of the unit pixels PX has two or more photoelectric conversion devices, each of the unit pixels PX may include a pixel circuit for processing electric charges generated by each of the two or more photoelectric conversion devices. In other words, when each of the unit pixels PX has two or more photoelectric devices, the pixel circuit may include two or more of at least one of a transfer transistor, a drive transistor, a select transistor, and a reset transistor.

The logic circuit 20 may include circuits for controlling the pixel array 10. For example, the logic circuit 20 may include a row driver 21, a readout circuit 22, a column driver 23, and a control logic 24.

The row driver 21 may drive the pixel array 10 by a row unit. For example, the row driver 21 may generate a transmission control signal for controlling the transfer transistor of a pixel circuit, a reset control signal for controlling the reset transistor, and a selection control signal for controlling the select transistor, and may input the signals to the pixel array 10 by a row unit.

The readout circuit 22 may include a correlated double sampler (CDS) and an analog-to-digital converter (ADC). The CDS may be connected to the unit pixels PX through column lines. The CDS may perform correlated double sampling by receiving a pixel signal from the unit pixels PX connected to a row line selected by a row line selection signal of the row driver 21. The pixel signal may be received through the column lines. The ADC may convert the pixel signal detected by the CDS into a digital pixel signal and may transmit the signal to the column driver 23.

The column driver 23 may include a latch for temporarily storing a digital pixel signal or a buffer circuit and an amplifier circuit, and may process a digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23.

Among the unit pixels PX, unit pixels PX disposed in the same position in a horizontal direction may share the same column line. For example, unit pixels PX disposed in the same position in a vertical direction may be simultaneously selected by the row driver 21 and may output pixel signals through column lines. In an example embodiment, the readout circuit 22 may simultaneously obtain a pixel signal from the unit pixels PX selected by the row driver 21 through column lines. The pixel signal may include a reset voltage and a pixel voltage, and the pixel voltage may be a voltage in which electric charges generated by each of the unit pixels PX is reflected in the reset voltage. The example described with reference to FIG. 1 is not limited thereto, and the image sensor may further include other elements and may be driven in various manners.

Figure 2:
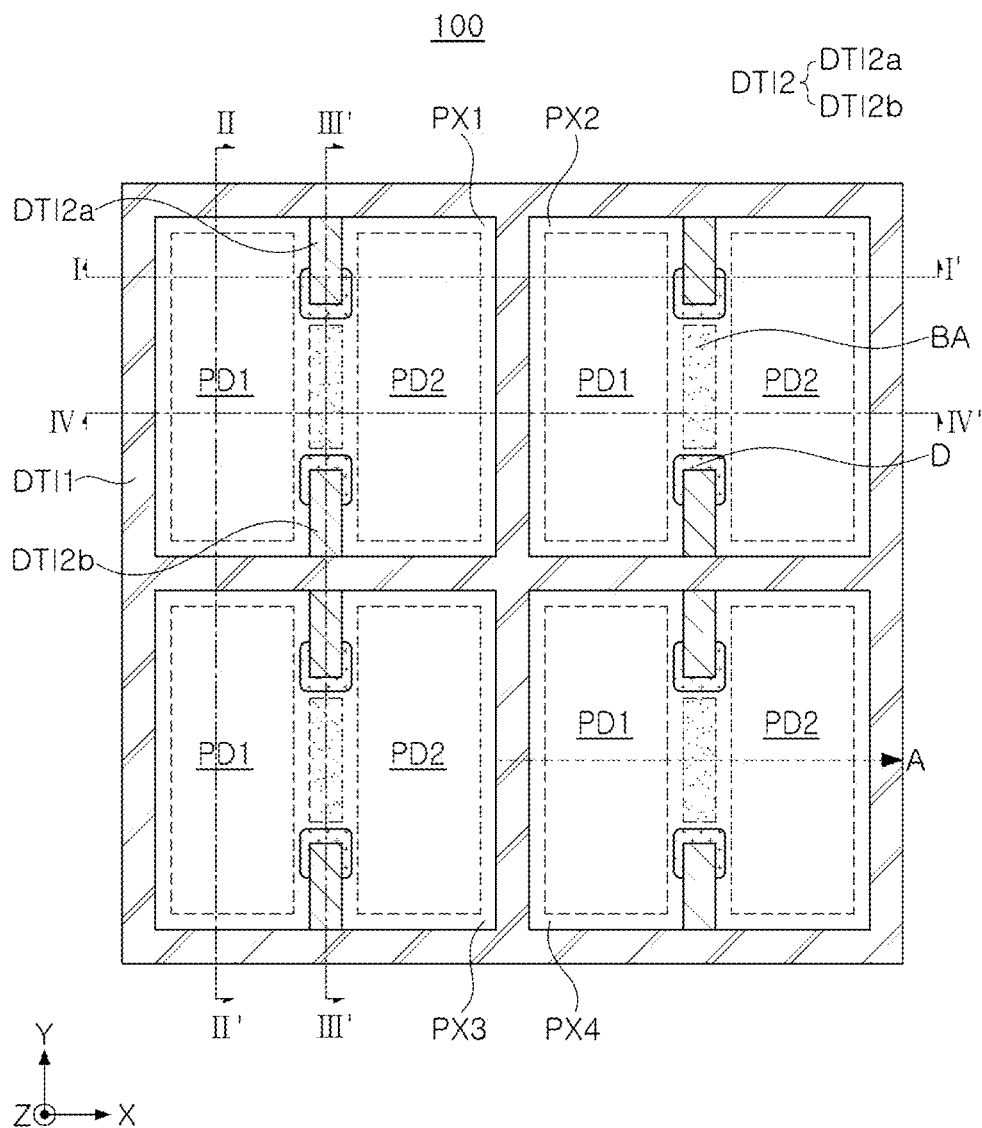
FIG. 2 is a diagram of an image sensor according to an example embodiment of the present disclosure, viewed from above.

FIG. 2 is a diagram illustrating an image sensor according to an example embodiment of the present disclosure, viewed from above.

Generally, an image sensor including two photodiodes in a single pixel region may include an internal isolation film to improve sensitivity. To smoothly operate the image sensor without signal saturation, it may be necessary to form a barrier area having a potential of an appropriate magnitude to control movement of electric charges between the two photodiodes. Accordingly, a method of isolating two photodiodes in each of a plurality of pixel regions may be desired. Also, since the pixel structure of an image sensor having an internal isolation film has a narrow isolation area between two photodiodes and a large aspect ratio, a method of controlling a barrier area to be formed may be desired. For example, when a general plasma doping (PLAD) process is used, impurities may be uniformly doped on a side surface of the entire device isolation film, but it may be difficult to selectively control a doping concentration in a specific position.

In order to address the above, the image sensor 100 in an example embodiment may include doped impurities on the side surfaces of device isolation films DTI1 and DTI2 by an ion implantation (IIP) process. A beam used for the doping in the process of manufacturing the image sensor 100 may be tilted and incident with respect to the plurality of pixel regions, e.g., pixel regions PX1, PX2, PX3, and PX4. Accordingly, the image sensor 100 in an example embodiment may control a depth to which impurities are doped in the substrate. In other words, the formation of the barrier area BA may be controlled by selectively adjusting the doping concentration in a specific position. However, an example embodiment thereof is not limited thereto, and a detailed manufacturing process in example embodiments will be described later.

Referring to FIG. 2, the image sensor 100 in an example embodiment may include first and second photodiodes PD1 and PD2, first device isolation film DTI1 disposed between pixel regions, e.g., pixel regions PX1, PX2, PX3, and PX4, and a pair of second device isolation films DTI2a and DTI2b (DTI2) disposed in each of the pixel regions, e.g., pixel regions PX1, PX2, PX3, and PX4.

In detail, the image sensor 100 in an example embodiment, may include a pixel array with a plurality of unit pixels, as described previously with reference to FIG. 1. For convenience, pixel regions PX1, PX2, PX3, and PX4 will be described hereinafter, where each of the pixel regions PX1, PX2, PX3, and PX4 may include a substrate and other circuits necessary for operation of the image sensor 100. For example, the substrate may be configured as a semiconductor substrate, and a first photodiode PD1 and a second photodiode PD2 for receiving light may be disposed in the substrate of each of the pixel regions PX1, PX2, PX3, and PX4.

The first device isolation film DTI1 and the second device isolation film DTI2 included in the image sensor 100 in an example embodiment may extend in a first direction (e.g., z direction). For example, the first device isolation film DTI1 and the second device isolation film DTI2 may include an insulating material.

Figure 3:
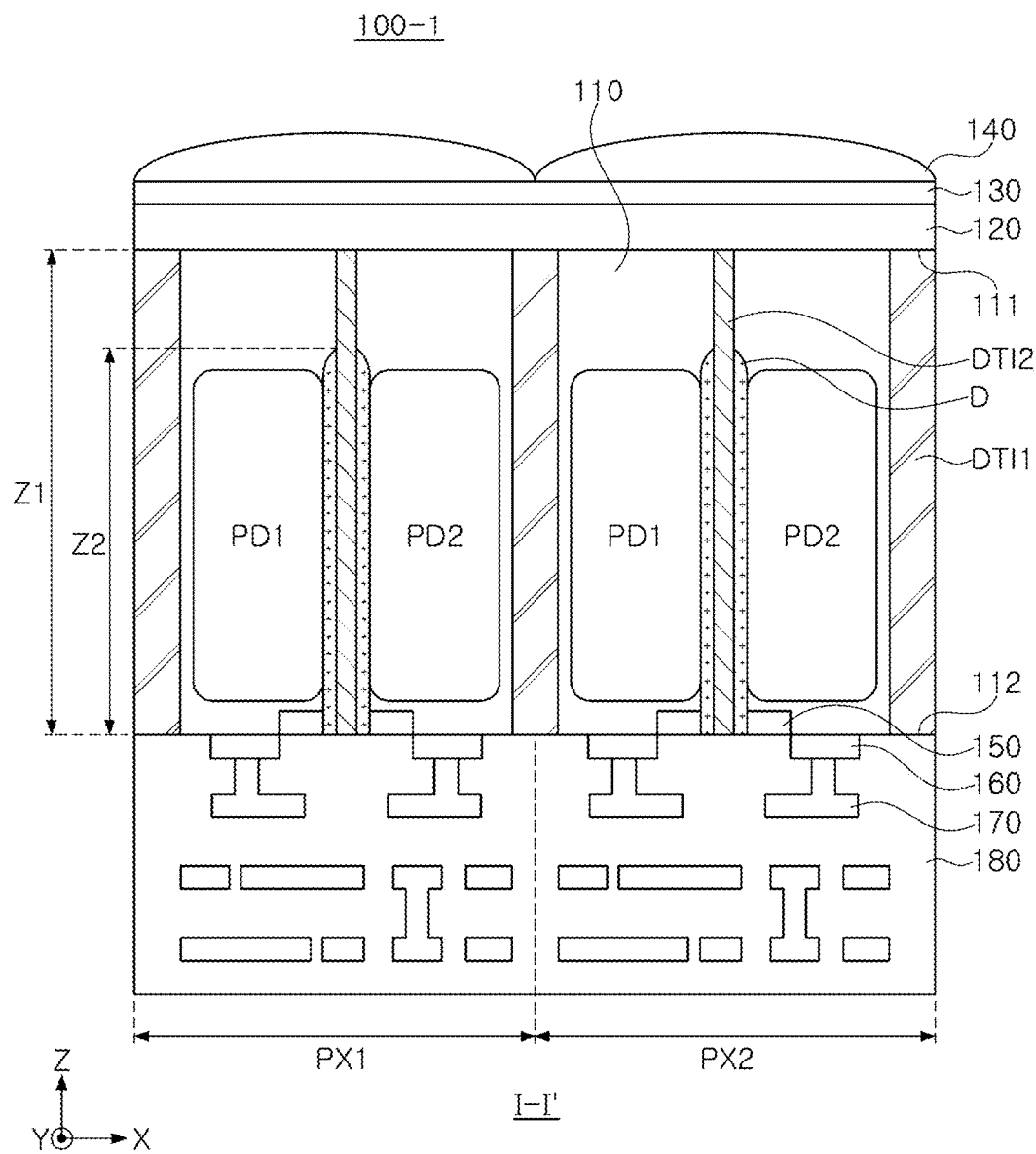
FIGS. 3 to 6 are cross-sectional diagrams of an image sensor according to an example embodiment of the present disclosure.

The first device isolation film DTI1 may isolate the pixel regions PX1, PX2, PX3, and PX4 from each other and may define each of the pixel regions PX1, PX2, PX3, and PX4. For example, as illustrated in FIGS. 2 and 3, the first device isolation film DTI1 may extend, e.g., continuously, through an entire thickness of the substrate to surround an entire perimeter of each of the pixel regions PX1, PX2, PX3, and PX4 in a top view, e.g., to have a grid pattern surrounding each of the pixel regions PX1, PX2, PX3, and PX4 in the top view.

The second device isolation film DTI2 may be configured as a boundary isolating the first photodiode PD1 and the second photodiode PD2, e.g., within each of the pixel regions PX1, PX2, PX3, and PX4. For example, the first and second photodiodes PD1 and PD2 may be isolated from each other in the second direction (e.g., the x direction) in each of the pixel regions PX1, PX2, PX3, and PX4. The second device isolation film DTI2 may be configured to extend from the first device isolation film DTI1 to a region between the first photodiode PD1 and the second photodiode PD2 in a third direction (e.g., y direction) perpendicular to the first and second directions. For example, as illustrated in FIG. 2, the second device isolation film DTI2 may include the pair of second device isolation films DTI2a and DTI2b between the first photodiode PD1 and the second photodiode PD2, such that each of the pair of the second device isolation films DTI2a and DTI2b may extend toward each other in the third direction (e.g., y direction) from the first device isolation film DTI1 on opposite sides of each of the pixel regions PX1, PX2, PX3, and PX4.

The image sensor 100 in an example embodiment may include a doped layer D formed prior to the first device isolation film DTI1 and the second device isolation film DTI2. For example, the doped layer D may be configured as an internal area of the substrate, which is doped with impurities. For example, the doped layer D may be isolated from the first device isolation film DTI1 in the third direction, e.g., the doped layer D may be separated from the first device isolation film DTI1 by the second device isolation film DTI2. However, the shape of the doped layer D is not limited to the example illustrated in FIG. 2, and may be varied depending on the shape of the second device isolation film DTI2 included in the image sensor 100 in an example embodiment and a method of manufacturing the image sensor 100.

The doped layer D formed in an area adjacent to the second device isolation film DTI2 may form a barrier area BA in the substrate of the image sensor 100. For example, as illustrated in FIG. 2, the doped layer D may be directly on and conformal on facing surfaces of the pair of the second device isolation films DTI2a and DTI2b to define the barrier area BA therebetween. For example, the barrier area BA may be disposed between the pair of second device isolation films DTI2a and DTI2b, e.g., along the third direction (e.g., y direction). The barrier area BA may be configured as an area having a potential greater than in the surrounding area, and accordingly, the barrier area BA may selectively move electric charges between the first photodiode PD1 and the second photodiode PD2, e.g., within each of the pixel regions PX1, PX2, PX3, and PX4.

Figure 4:
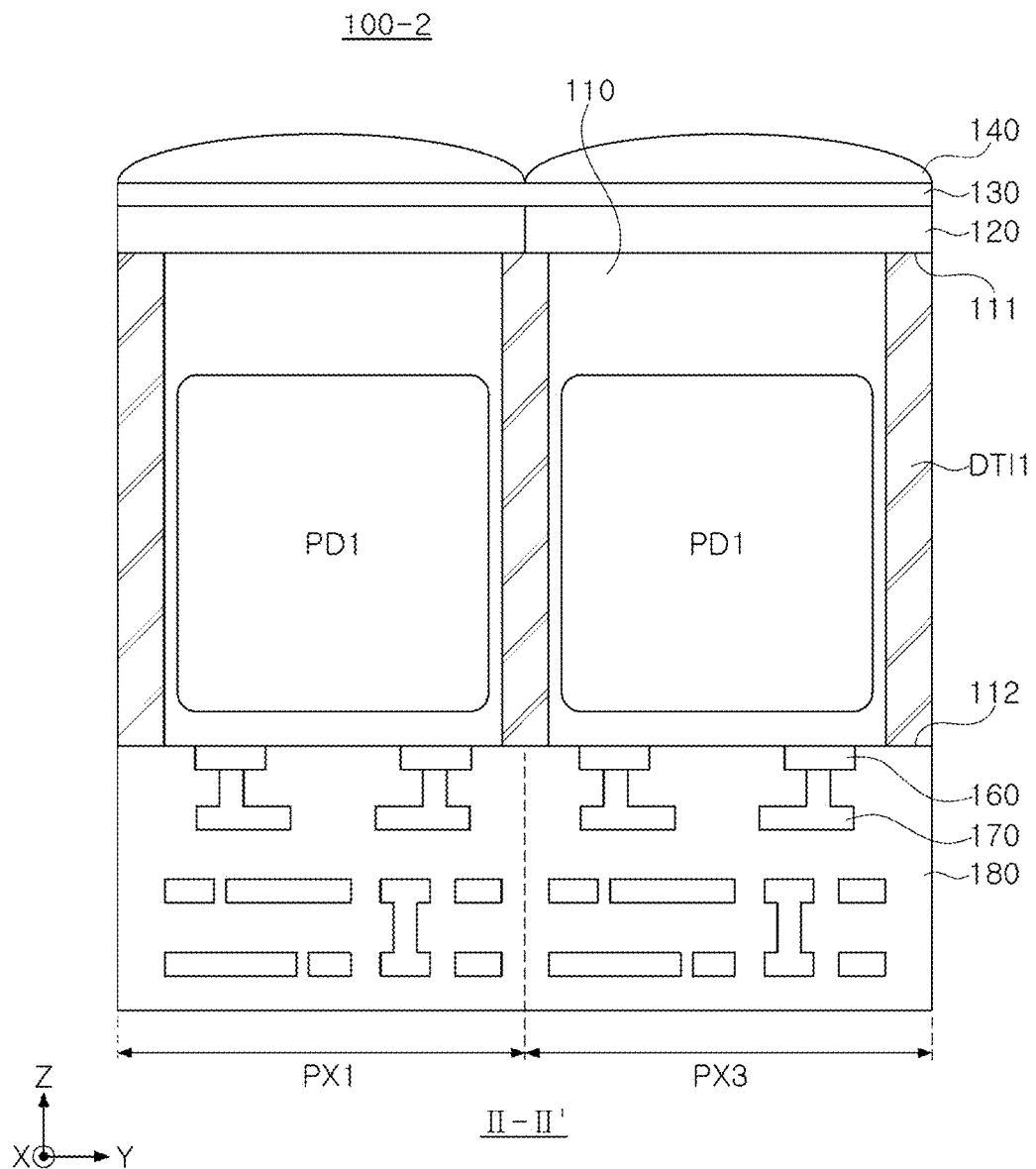
Figure 5:
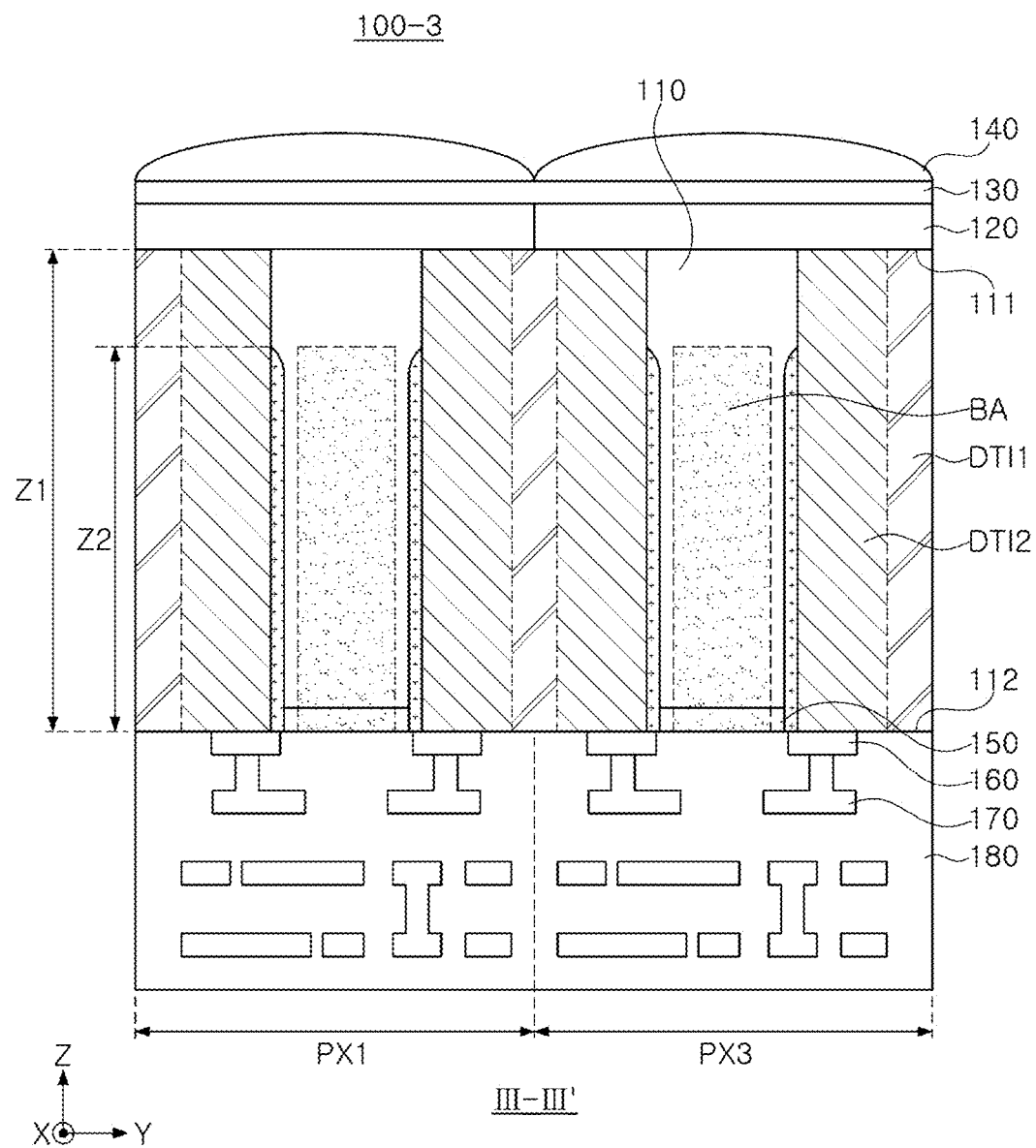
Figure 6:
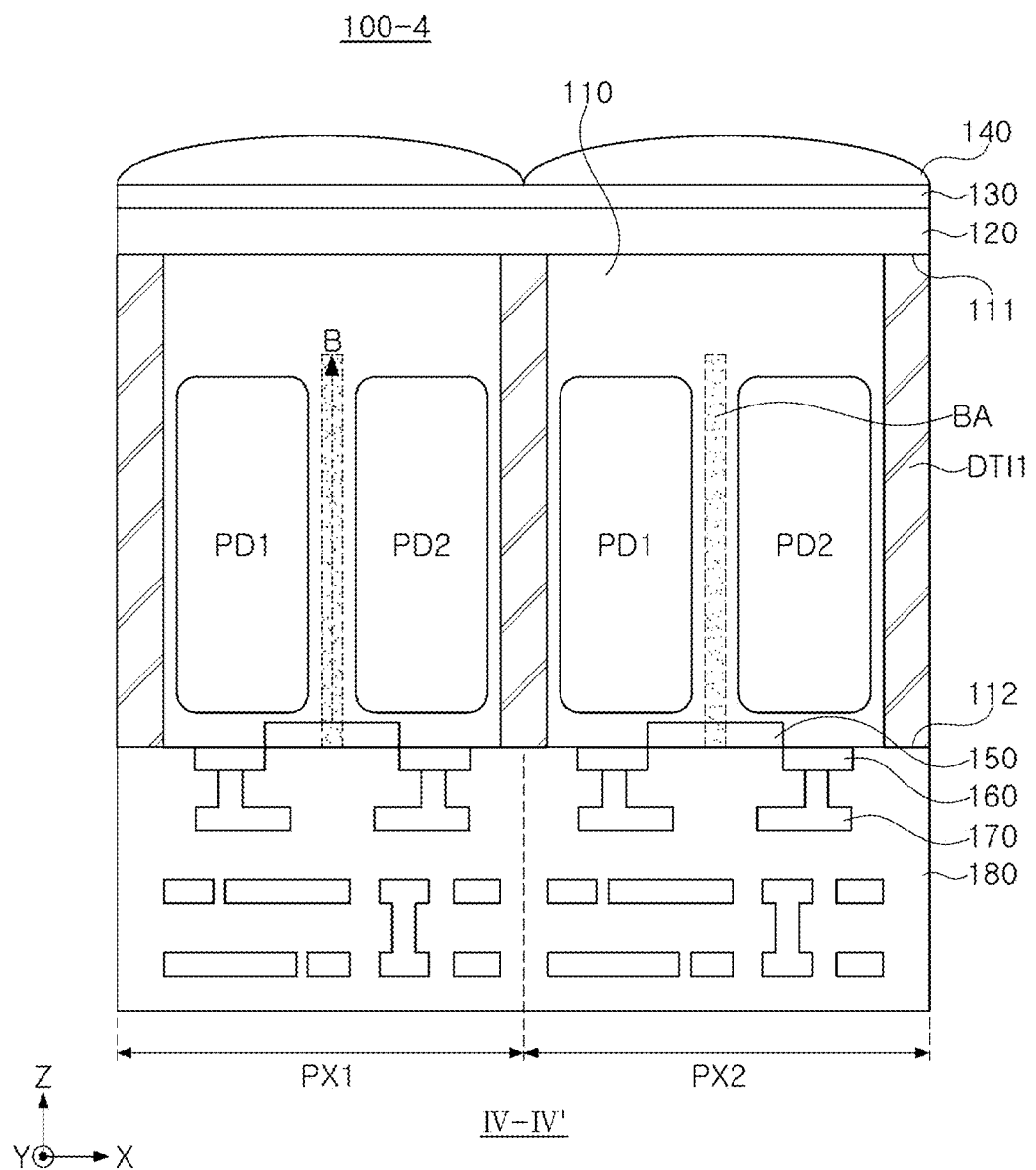

FIGS. 3 to 6 are cross-sectional diagrams illustrating an image sensor according to an example embodiment. In detail, FIGS. 3 to 6 are cross-sectional diagrams illustrating the image sensor 100 illustrated in FIG. 2 along lines I-I' to IV-IV', respectively. That is, FIG. 3 is a cross-sectional diagram along line I-I' in FIG. 2, FIG. 4 is a cross-sectional diagram along line II-II' in FIG. 2, FIG. 5 is a cross-sectional diagram along line III-III' in FIG. 2, and FIG. 6 is a cross-sectional diagram along line IV-IV' in FIG. 2.

Image sensors 100-1, 100-2, 100-3, and 100-4 illustrated in FIGS. 3 to 6 are examples of a three-dimensional structure of the image sensor 100 in FIG. 2. Accordingly, the image sensors 100-1, 100-2, 100-3, and 100-4 illustrated in FIGS. 3 to 6 are cross-sectional diagrams of the single image sensor 100, e.g., the image sensors 100-1, 100-2, 100-3, and 100-4 represent different views of the same single image sensor 100 (rather than separate independent image sensors). The image sensors 100-1, 100-2, 100-3, and 100-4 illustrated in FIGS. 3 to 6 are merely examples, and example embodiments thereof are not limited thereto, and other elements may be added or a portion of the elements may not be provided if desired.

Referring to FIGS. 3 to 6, the image sensors 100-1, 100-2, 100-3, and 100-4 in example embodiments may include a substrate 110 having a first surface 111 and a second surface 112 opposing each other, the first device isolation film DTI1 isolating the pixel regions PX1, PX2, PX3, and PX4 from each other in the substrate 110, and the second device isolation film DTI2 disposed in at least one of the pixel regions PX1, PX2, PX3, and PX4 and isolating the first photodiode PD1 and the second photodiode PD2 from each other. For example, the pixel regions PX1, PX2, PX3, and PX4 may be arranged in a direction parallel to the first surface 111. Each of the pixel regions PX1, PX2, PX3, and PX4 may include the first photodiode PD1 and the second photodiode PD2 isolated from each other in a second direction (e.g., an x direction).

In the image sensor 100-1, 100-2, 100-3, and 100-4 in an example embodiment, the second device isolation film DTI2 may include the pair of device isolation films configured to extend from the first device isolation film DTI1 into the pixel regions PX1, PX2, PX3, and PX4 in a third direction (e.g., y direction). However, an example embodiment thereof is not limited thereto, and the second device isolation film DTI2 may be configured as a single isolation film extending integrally in example embodiments.

In the image sensors 100-1, 100-2, 100-3, and 100-4 in an example embodiment, the first device isolation film DTI1 and the second device isolation film DTI2 may be configured to extend in the first direction (e.g., z direction) in the substrate 110 including a semiconductor device. For example, the first device isolation film DTI1 and the second device isolation film DTI2 may be formed simultaneously or individually. The first device isolation film DTI1 and the second device isolation film DTI2 may be formed in trenches formed on the second surface 112 of the substrate 110. Accordingly, the first device isolation film DTI1 may extend from the second surface 112 of the substrate toward the first surface 111. In example embodiments, it may be assumed that the first device isolation film DTI1 and the second device isolation film DTI2 may be configured to extend from the second surface 112 to the first surface 111 of the substrate. However, an example embodiment thereof is not limited thereto. Alternatively, the first device isolation film DTI1 and the second device isolation film DTI2 may extend from the first surface 111 toward the second surface 112 in example embodiments.

As described above, the image sensors 100-1, 100-2, 100-3, and 100-4 in an example embodiment may further include the doped layer D selectively doped by performing an IIP process using a beam tilted and incident before the first device isolation film DTI1 and the second device isolation film DTI2 are formed. As an example, the doped layer D may be formed on the substrate 110 adjacent to the second device isolation film DTI2, and may be formed by a predetermined depth, spaced apart from the first surface 111 from the second surface 112 in the first direction (FIG. 3).

The doped layer D may be adjacent to the second device isolation film DTI2 doped with impurities by a beam. For example, the doped layer D may include P-type impurities, e.g., boron (B), or N-type impurities, e.g., phosphorus (P) or arsenic (As). However, an example embodiment thereof is not limited thereto. A concentration of impurities included in the doped layer D may be greater than a concentration of impurities in an area of the substrate 110 other than the doped layer D. Accordingly, impurities included in the doped layer D may diffuse to the surroundings. For example, referring to FIG. 5, the diffused impurities may form the barrier area BA having a specific form of potential distribution. The formed barrier area BA may control movement of electric charges between the two photodiodes to perform a CIS operation smoothly.

A length of the doped layer D in the first direction may be smaller than a length of the second device isolation film DTI2, as illustrated in FIGS. 3 and 5. For example, the length of the second device isolation film DTI2 may be Z1, i.e., a distance between the first surface 111 and the second surface 112. The doped layer D may extend from the second surface 112, and the length of the doped layer D may be Z2 smaller than Z1.

Referring to FIGS. 3 to 6, shapes in which the device isolation films DTI1 and DTI2, the photodiodes PD1 and PD2, and the doped layer D are formed may be varied depending on a cut-out position and cut-out direction of the cross sectional surface. As an example, in the cross-sectional view of the image sensor 100-1 illustrated in FIG. 3, all the first and second device isolation films DTI1 and DTI2, the first and second photodiodes PD1 and PD2, and the doped layer D may appear. In the cross-sectional view of the image sensor 100-2 illustrated in FIG. 4, only the first device isolation film DTI1 and the first photodiode PD1 are visible. Also, in the cross-sectional view of the image sensor 100-3 illustrated in FIG. 5, the first and second device isolation films DTI1 and DTI2 and the doped layer D, without the first and second photodiodes PD1 and PD2, are visible. Also, in the cross-sectional view of the image sensor 100-4 illustrated in FIG. 6, the first and second photodiodes PD1 and PD2 and the first device isolation film DTI1 are visible. However, an example embodiment thereof is not limited thereto, and the shape of the cross-sectional surface of the image sensor 100 illustrated in FIG. 2 may be varied in example embodiments.

The image sensors 100-1, 100-2, 100-3, and 100-4 in an example embodiment may further include various elements required for operation of the image sensor. For example, each of the pixel regions PX1, PX2, PX3, and PX4 may include a color filter 120, a light transmission layer 130, and a microlens 140 disposed on the first surface 111 of the substrate 110. For example, each of the pixel regions PX1, PX2, PX3, and PX4 may include a single microlens 140 disposed above the first photodiode PD1 and the second photodiode PD2, e.g., a single microlens 140 may completely overlap tops of both the first photodiode PD1 and the second photodiode PD2 in each of the pixel regions PX1, PX2, PX3, and PX4. Accordingly, light passing through the microlens 140 may be incident on both the first photodiode PD1 and the second photodiode PD2.

A pixel circuit may be disposed below the first photodiode PD1 and the second photodiode PD2. As an example, the pixel circuit may include a plurality of devices 160, wiring patterns 170 connected to the plurality of devices 160, and an insulating layer 180 covering the plurality of devices 160 and the wiring patterns 170, and may be disposed on the second surface 112 of the substrate 110. The pixel circuit may include a floating diffusion area 150. For example, each of the pixel regions PX1, PX2, PX3, and PX4 may include a floating diffusion area 150 disposed below at least one of the first photodiode PD1 and the second photodiode PD2. As an example, each of the floating diffusion areas 150 may be electrically connected to each other by at least one of the wiring patterns 170, and a position and a size of each of the floating diffusion areas 150 may be varied in example embodiments. In the image sensor 100 in an example embodiment, the plurality of devices 160 adjacent to the floating diffusion area 150 may be configured as transfer transistors. For example, the transfer transistor gate may have a vertical structure of which at least a partial area is buried in the substrate 110.

Figure 7A:
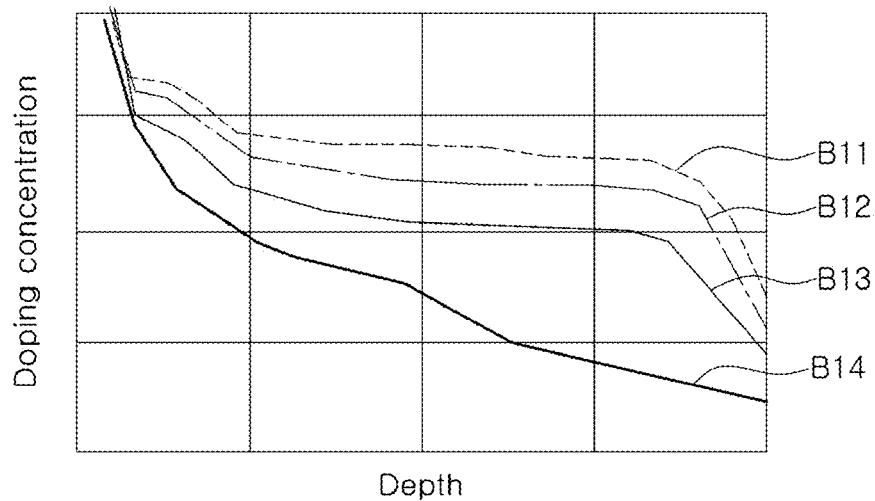
FIGS. 7A and 7B are diagrams of an image sensor according to an example embodiment of the present disclosure.
Figure 7B:
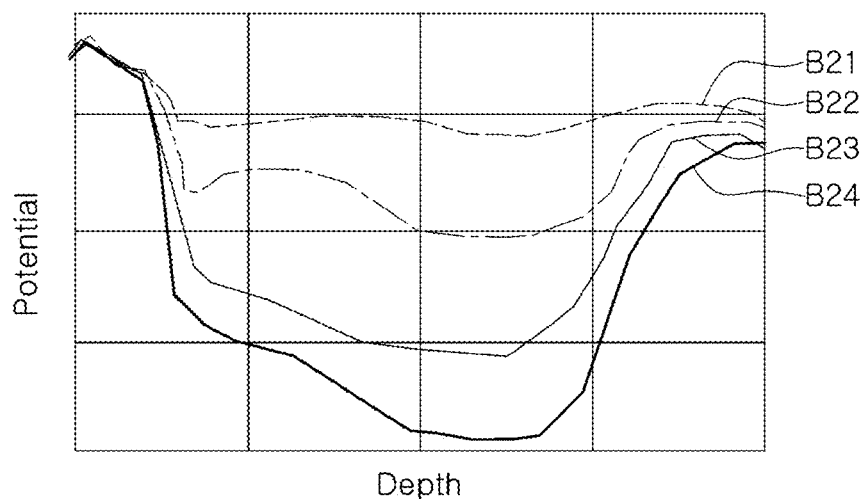

FIGS. 7A and 7B are diagrams illustrating doping concentration and potential of the doped layer D in the image sensor 100. That is, FIGS. 7A and 7B are diagrams illustrating changes in the doping concentration and the potential of the doped layer D and the substrate 110 with respect to the depth in the B-direction in the image sensor 100-4 illustrated in FIG. 6, respectively. As an example, the B direction may be a first direction, and the depth may be defined as increasing toward the first surface 111 from the second surface 112.

In detail, in the image sensor 100 in the example embodiment illustrated in FIG. 2, in order to form the barrier area BA having a potential with an appropriate magnitude, it is important to control the doping concentration and the potential in the doped layer D. Therefore, according to the method of manufacturing the image sensor 100 in an example embodiment, a depth to which the doped layer D is formed may be adjusted to control the doping concentration and the potential in the doped layer D. As an example, the depth to which the doped layer D is formed may be determined by an incident angle of the beam in the IIP process and the shape of the second device isolation film DTI2.

Referring to FIG. 7A, the doping concentration of the doped layer D and the substrate 110 may decrease as the depth increases, i.e., depth increases from the second surface 112 toward the first surface 111 in the B-direction of FIG. 6. For example, as the depth of the doped layer D increases, the doping concentration of the doped layer D and the substrate 110 may increase in the depth. A change in the doping concentration at a boundary between the doped layer D and the substrate 110 may further increase. Accordingly, the doped layer D may have the greatest depth in graph B11 in which the doping concentration is the highest in the same depth and the doping concentration rapidly changes in the deepest position, e.g., a doping concentration is the highest and remains almost unchanged until a sharp drop in the doping concentration at the deepest position. Otherwise, the doped layer D may have the least depth in graph B14 in which the doping concentration is the lowest and a change in the doping concentration is not high, e.g., the doping concentration is the lowest with a gradual decreasing doping concentration throughout a majority of the depth. In other words, the doping concentration with respect to the depth of the doped layer D may decrease in the order of graph B11, graph B12, graph B13, and graph B14.

Referring to FIG. 7B, the magnitude of the potentials of the doped layer D and the substrate 110 may gradually decrease as the depth increases, and the magnitude may increase again. As described above, as the depth of the doped layer D increases, the doping concentration in the same depth may increase, and when the doping concentration increases, a maximum potential may increase. For example, the depth of the doped layer D may decrease in the order of graph B21, graph B22, graph B23, and graph B24.

A depth of a doped layer required to obtain a desired doping concentration and a desired potential may be determined with reference to the graphs illustrated in FIGS. 7A and 7B. The depth of the doped layer may be controlled by the method of manufacturing the image sensor 100 in an example embodiment. However, the graphs illustrated in FIGS. 7A and 7B are merely results of simulation and an example embodiment thereof is not limited thereto.

Figure 8A:
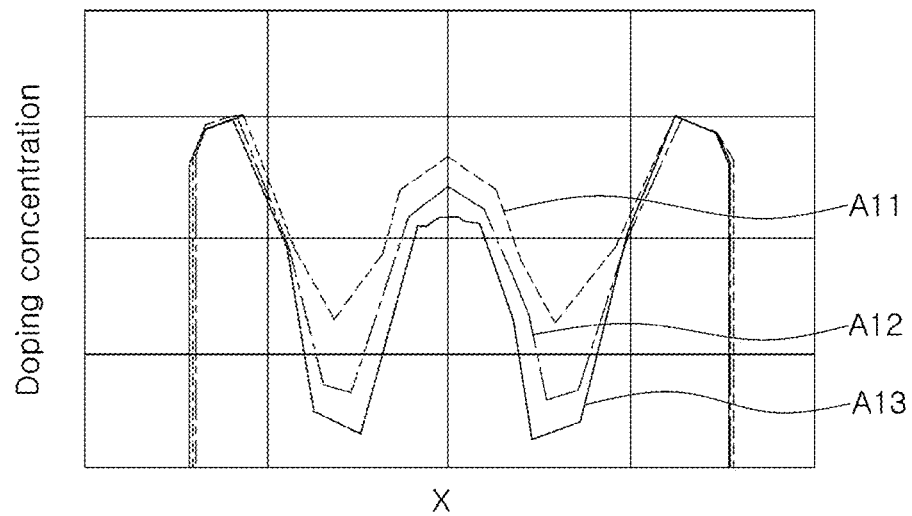
FIGS. 8A and 8B are diagrams of an image sensor according to an example embodiment of the present disclosure.
Figure 8B:
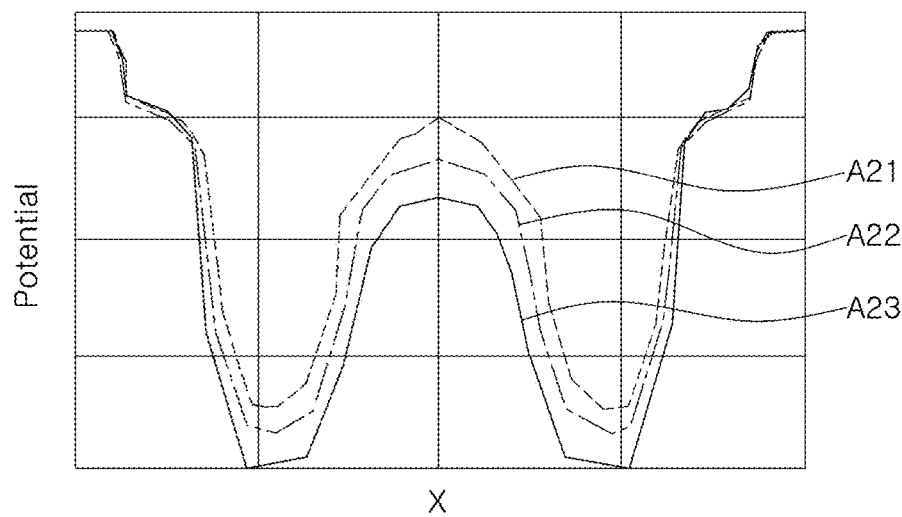

FIGS. 8A and 8B are diagrams illustrating changes in the doping concentration and the potential of the substrate 110 with respect to the position X in the A direction in the image sensor 100 illustrated in FIG. 2. For example, the A direction in FIG. 2 may be the second direction, and the position X may be defined as a position from the first device isolation film DTI1 on one side to the first device isolation film DTI1 on the other side in a single pixel region.

By controlling the doping concentration and the potential in the doped layer D using the graphs illustrated in FIGS. 7A and 7B, the barrier area BA having a potential of an appropriate magnitude may be formed in the image sensor 100 in the example embodiment illustrated in FIG. 2.

Referring to FIGS. 2 and 8A, the doping may not be performed on a boundary portion in which the first device isolation film DTI1 including an insulating material is disposed. A high doping concentration may be obtained between the second device isolation films DTI2 by the doped layer D. For example, since the depth of the doped layer D increases, the doping concentration may increase in the same depth, and thus, the doped layer D may have the greatest depth in graph A11 having the highest doping concentration between the second device isolation films DTI2. In other words, the depth of the doped layer may decrease in the order of graph A11, graph A12, and graph A13.

Referring to FIG. 8B, the potential of the substrate 110 may have a distribution similar to that of the doping concentration illustrated in FIG. 8A. However, the magnitude of the potential may be the biggest on a boundary portion in which the first device isolation film DTI1 including an insulating material is disposed. For example, a relatively bigger potential may be obtained between the second device isolation films DTI2 having a relatively high doping concentration, higher than that of the surrounding area. As an example, the peripheral area may refer to an area between the first photodiode PD1 and the second photodiode PD2 and the barrier area BA in the pixel region of the image sensor 100 illustrated in FIG. 2. However, an example embodiment thereof is not limited thereto, and the peripheral area may refer to an area in which electric charges may move freely, and the barrier area BA may refer to an area in which electric charges may not be able to move freely. As described above, as the depth of the doped layer D increases, the doping concentration in the same depth may increase, and as the doping concentration increases, the maximum potential may increase. For example, the depth of the doped layer may decrease in the order of graph A21, graph A22, and graph A23.

A depth of the doped layer required to obtain the barrier area having a desired doping concentration and a desired potential may be determined with reference to the graphs illustrated in FIGS. 8A and 8B. As an example, the potential of the barrier area may prevent electric charges from moving freely between the two photodiodes, and may also act as an electric charge overflow barrier for smooth CIS operation without signal saturation. For example, the image sensor 100 in an example embodiment may control the movement of electric charges using a barrier area having a predetermined potential if desired. The potential of the barrier area may be determined by controlling the depth of the doped layer in the method of manufacturing the image sensor 100 in the example embodiment. However, the graphs illustrated in FIGS. 8A and 8 are merely results of simulation and an example embodiment thereof is not limited thereto.

Figure 9A:
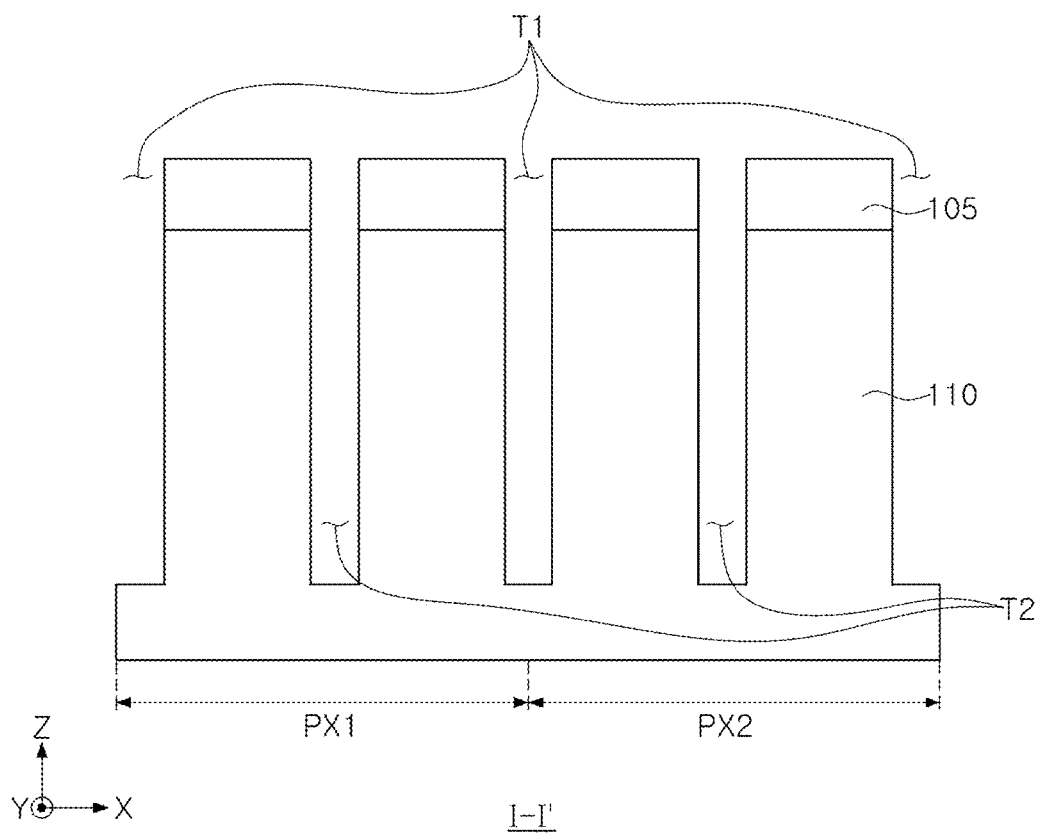
FIGS. 9A and 9B are a cross-sectional diagram and a diagram viewed from above, illustrating a method of manufacturing an image sensor according to an example embodiment of the present disclosure.
Figure 9B:
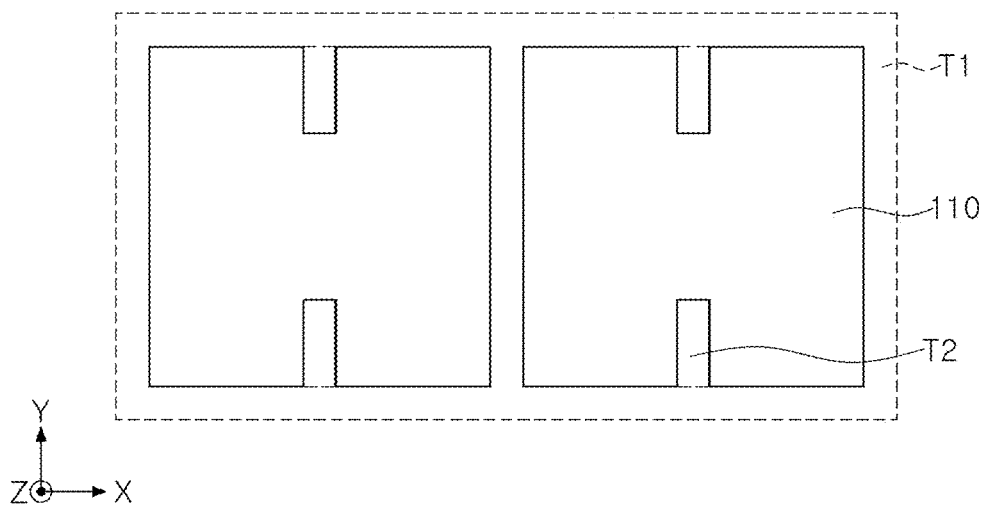

FIGS. 9A and 9B are a cross-sectional diagram and a diagram viewed from above, illustrating a method of manufacturing an image sensor according to an example embodiment. FIGS. 9A and 9B illustrate one process of manufacturing the image sensor 100. For example, the cross-sectional diagram illustrated in FIG. 9A is of one process of manufacturing the image sensor 100 taken along line I-I'. For example, the upper surface illustrated in FIG. 9B is of the image sensor in the process illustrated in FIG. 9A.

Referring to FIGS. 9A and 9B, a method of manufacturing an image sensor in an example embodiment may include forming a first trench T1 configured to extend in the first direction and to isolate pixel regions from each other on the substrate 110 before a device isolation film is formed, e.g., the first trench T1 may have a grid shape in a top view (FIG. 9B). The method of manufacturing an image sensor in an example embodiment may further include forming second trenches T2 configured to be connected to the first trench T1, to extend in the first direction and to be disposed between a first photodiode and a second photodiode (FIG. 9B). For example, forming the first trench T1 and the second trenches T2 may be performed sequentially or simultaneously. However, an example embodiment thereof is not limited thereto.

In the method of manufacturing the image sensor in an example embodiment, to form the first trench T1 and the second trenches T2, a first mask layer 105 may be formed on an upper surface of the substrate 110 on one side. For example, the first mask layer 105 may be configured to protect the substrate 110 from being etched in an etching process for forming the first trenches T1 and the second trenches T2. The first trenches T1 and the second trenches T2 may be formed by an etching process subsequently performed after the first mask layer 105 is formed. The first trench T1 and the second trenches T2 illustrated in FIG. 9A may have the same thickness and the same depth, but an example embodiment thereof is not limited thereto. The shapes of the first trench T1 and the second trenches T2 may be varied.

Figure 10A:
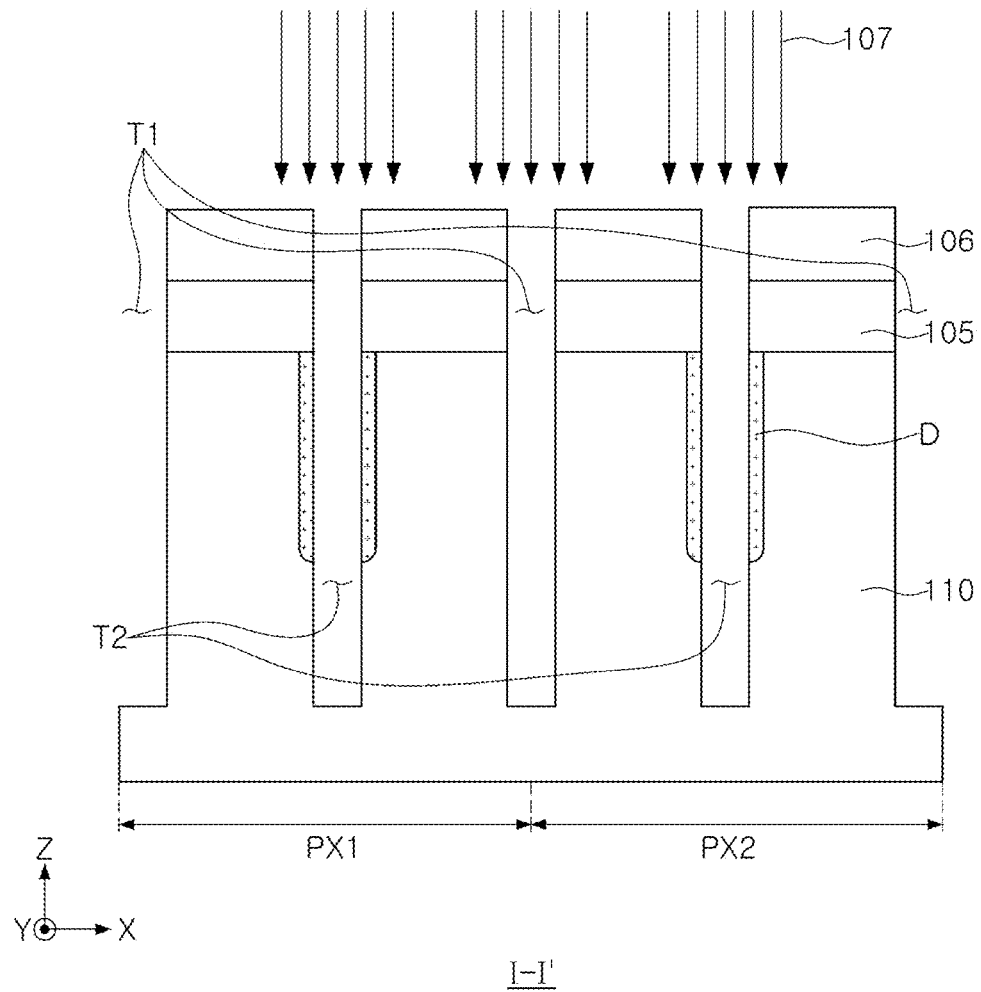
FIGS. 10A and 10B are a cross-sectional diagram and a diagram viewed from above, illustrating a method of manufacturing an image sensor according to an example embodiment of the present disclosure.
Figure 10B:
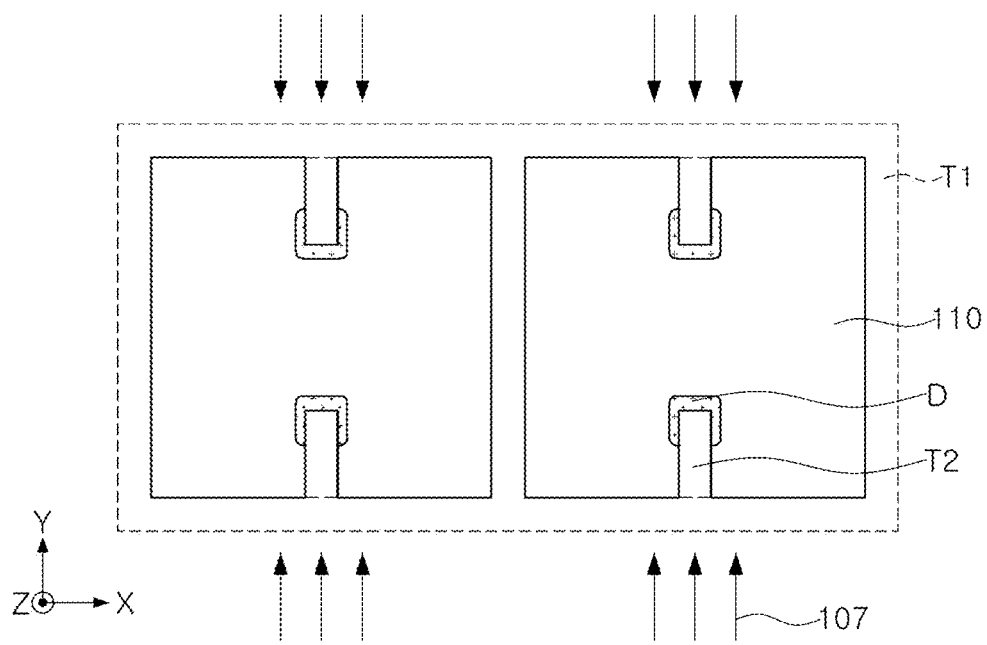

FIGS. 10A and 10B are a cross-sectional diagram and a diagram viewed from above, illustrating a method of manufacturing an image sensor according to an example embodiment. FIGS. 10A and 10B illustrate one process of manufacturing an image sensor according to an example embodiment. For example, the cross-sectional diagram illustrated in FIG. 10A is of one process of manufacturing the image sensor 100 taken along line I-I'. For example, the upper surface illustrated in FIG. 10B is of the image sensor in the process illustrated in FIG. 10A.

Referring to FIGS. 10A and 10B, the method of manufacturing an image sensor in an example embodiment may include implanting impurities into the substrate 110 using a beam 107 incident through second trenches T2. The process may be implemented by an IIP process, and impurities may be doped in a portion of the substrate 110 adjacent to the second trenches T2 by the IIP process. For example, a partial area of the substrate 110 doped with impurities may be defined as the doped layer D. However, an example embodiment thereof is not limited to the example in FIG. 10A. For example, a length of the doped layer D in the first direction may be varied in example embodiments. Also, although FIG. 10A does not illustrate an area doped by the beam 107 incident through the first trench T1, a partial area of the substrate 110 adjacent to the first trench T1 may be doped with impurities in example embodiments.

Referring to FIG. 10B, in the method of manufacturing an image sensor in an example embodiment, the beam 107 may be irradiated through the second trenches T2 to be incident on a surface of the substrate perpendicular to the second direction, i.e., on the internal sidewalls of the second trenches T2. The beam 107 may be irradiated at a predetermined angle, e.g., an oblique angle, with respect to the first direction. For example, the beam 107 may be tilted and incident in the third direction.

As described above, the predetermined angle at which the beam 107 is incident may be determined based on the depth to which impurities may be implanted into the substrate 110 in the first direction. However, an example embodiment thereof is not limited thereto, and the depth of the substrate 110 in the first direction by which the impurities are implanted may be determined from a predetermined angle at which the beam 107 is incident. Also, referring back to FIG. 7A, in the process of implanting the impurities into the substrate 110, a concentration of the impurities implanted into the substrate 110 may be controlled based on a predetermined angle at which the beam 107 is incident.

In the method of manufacturing an image sensor in an example embodiment, to form the doped layer D, the second mask layer 106 may be formed on the upper surface of the first mask layer 105. For example, the second mask layer 106 may include a photosensitive polymer material. For example, the second mask layer 106 may be configured to prevent channeling into the substrate 110 in the IIP process. However, an example embodiment thereof is not limited thereto, and the IIP process may be performed in a state in which only the first mask layer 105 is present without the process of forming the second mask layer 106.

Figure 11A:
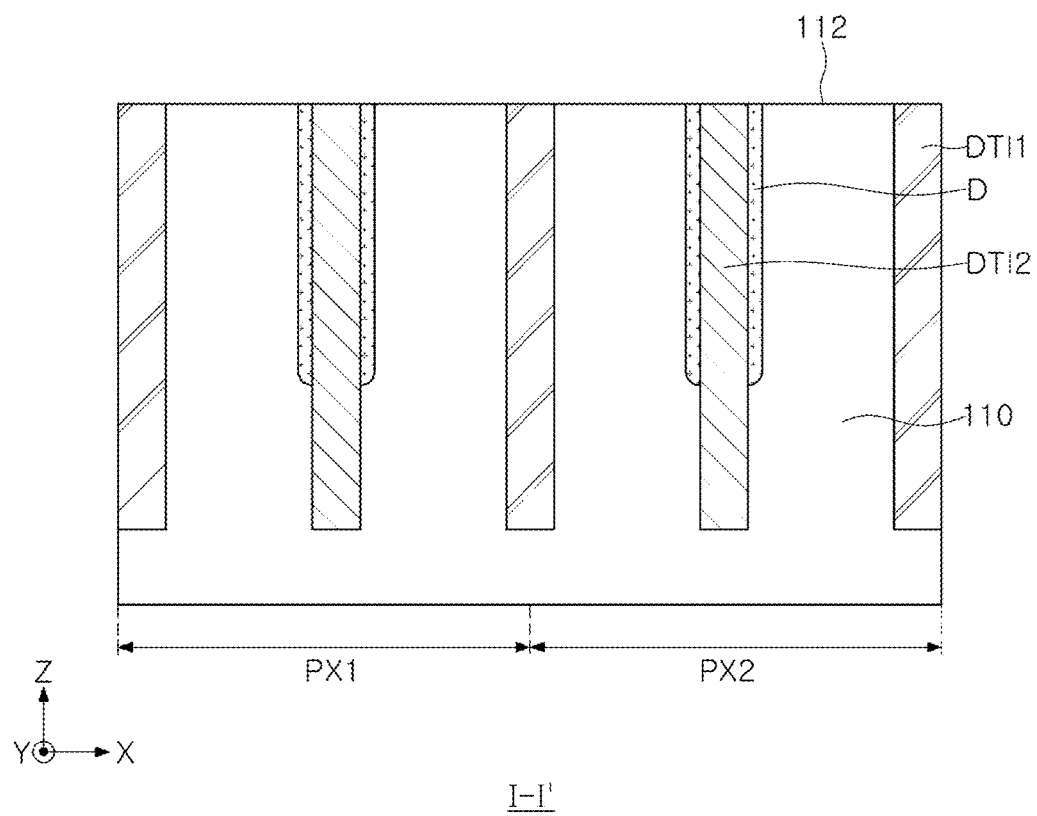
FIGS. 11A and 11B are a cross-sectional diagram and a diagram viewed from above, illustrating a method of manufacturing an image sensor according to an example embodiment of the present disclosure.
Figure 11B:
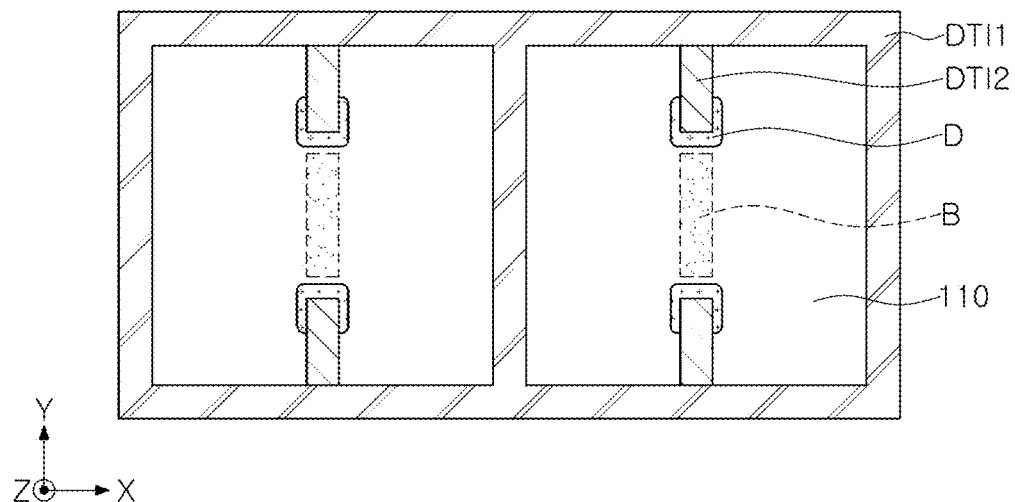

FIGS. 11A and 11B are a cross-sectional diagram and a diagram viewed from above, illustrating a method of manufacturing an image sensor according to an example embodiment. FIGS. 11A and 11B illustrate one process of manufacturing an image sensor according to an example embodiment. For example, the cross-sectional diagram illustrated in FIG. 11A is of one process of manufacturing the image sensor 100 illustrated in FIG. 2 taken along line I-I'. For example, the upper surface illustrated in FIG. 11B is of the image sensor in the process illustrated in FIG. 11A.

Referring to FIGS. 11A and 11B, a method of manufacturing an image sensor in an example embodiment may include forming the first device isolation film DTI1 in the first trench T1, and forming the second device isolation film DTI2 in the second trenches T2. For example, the second device isolation film DTI2 may include a pair of device isolation films configured to extend from the first device isolation film DTI1 into a pixel region in a third direction and to oppose each other. A process of forming the barrier area BA between the pair of second device isolation films DTI2 may be further included by the doped layer D formed in the prior process, e.g., the barrier area BA may be formed during formation of the doped layer D before formation of the second device isolation films DTI2. For example, the barrier area BA may be disposed between the first photodiode and the second photodiode.

As described above, the doping concentration and the maximum potential in the barrier area BA may be determined by the incident angle of the beam incident in a prior process to dope impurities, as described with reference to FIGS. 10A and 10B. Since the barrier area BA is formed by the doped layer D, the position of the barrier area BA may also be determined by the incident angle of the beam 107 incident in the prior process. The first mask layer and/or the second mask layer formed to perform the prior processes may be removed by a polishing process, or the like. For example, the upper surface of the substrate 110 after the polishing process may be the second surface 112. However, an example embodiment thereof is not limited to the example illustrated in FIGS. 11A and 11B. For example, the doping concentration and the maximum potential in the barrier area BA may be varied depending on an incident angle of the beam and also intensity of a dopant ion beam incident in the process. Intensity of the dopant ion beam may change the position in which the barrier area BA is formed.

Figure 12:
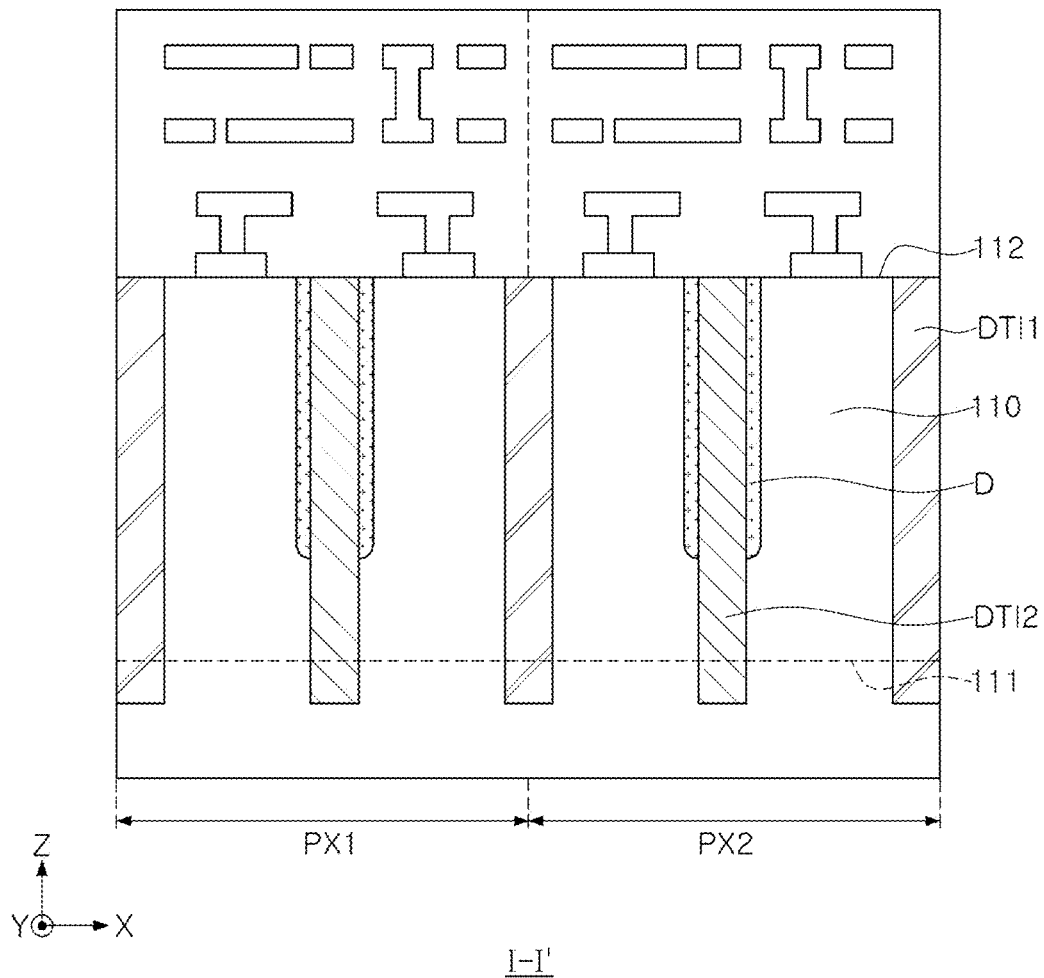
FIG. 12 is a cross-sectional diagram of a method of manufacturing an image sensor according to an example embodiment of the present disclosure.

FIG. 12 is a cross-sectional diagram illustrating a method of manufacturing an image sensor according to an example embodiment. FIG. 12 illustrates one process of manufacturing an image sensor according to an example embodiment. For example, the cross-sectional diagram illustrated in FIG. 12 is of one process of manufacturing the image sensor 100 illustrated in FIG. 2 taken along line I-I'.

Referring to FIG. 12, a method of manufacturing an image sensor in an example embodiment may include disposing a pixel circuit on the second surface 112 of the substrate 110. As described above, the pixel circuit may include a plurality of devices, wiring patterns connected to the plurality of devices, and an insulating layer covering the plurality of devices and the wiring patterns. A partial area of the substrate 110 may be removed by a polishing process on the opposite side of the pixel circuit. For example, the area to be removed may include a portion of the first device isolation film DTI1 and the second device isolation film DTI2. For example, one surface of the substrate 110 remaining after the removal by the polishing process may be defined as the first surface 111. However, an example embodiment thereof is not limited to the example illustrated in FIG. 12. The image sensor in an example embodiment may include a color filter, a light transmissive layer, and a microlens, disposed in order on the first surface 111 defined as above. Accordingly, the image sensor 100-1 illustrated in FIG. 3 may be manufactured.

FIGS. 13A to 14C are cross-sectional diagrams illustrating a method of manufacturing an image sensor according to an example embodiment. FIGS. 13A to 14C are cross-sectional diagrams illustrating reading depths D11, D12, D13, D21, D22, and D23 depending on incident angles θ1, θ2, and θ3 of the beam 107 used in the IIP process.

Figure 13A:
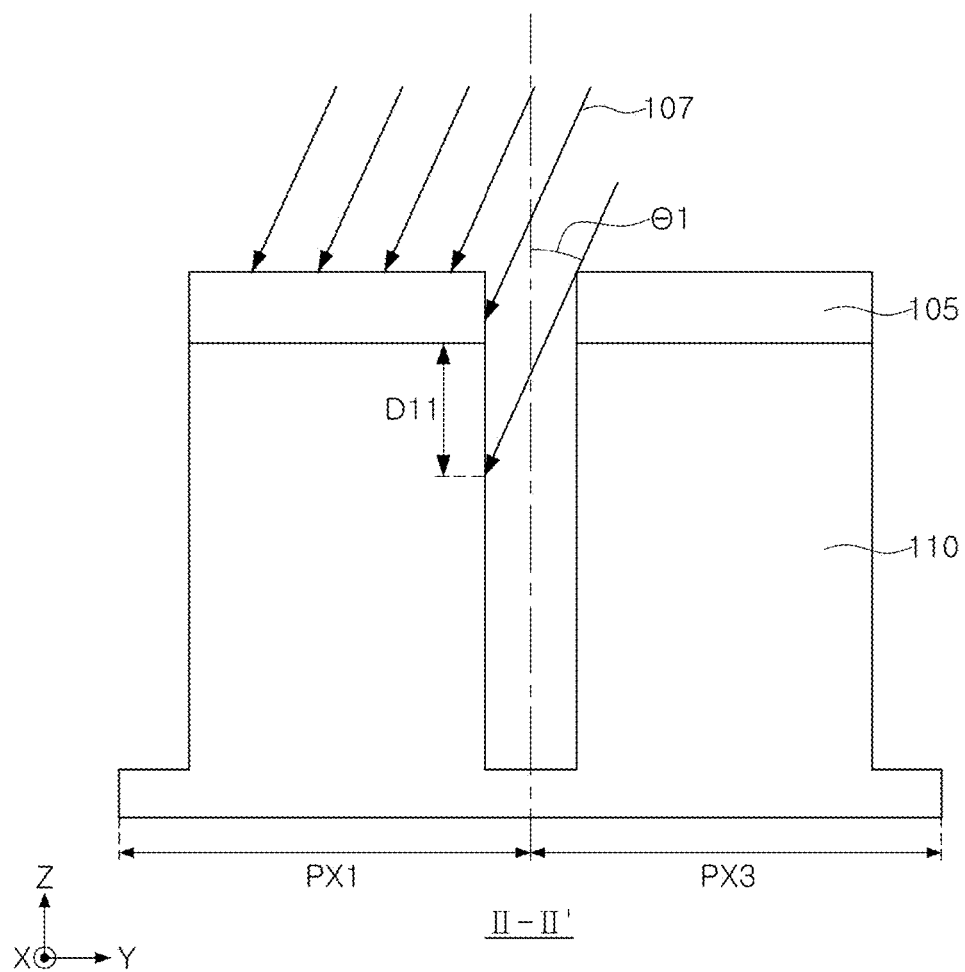
FIGS. 13A to 13C are cross-sectional diagrams of stages in a method of manufacturing an image sensor according to an example embodiment of the present disclosure.
Figure 13B:
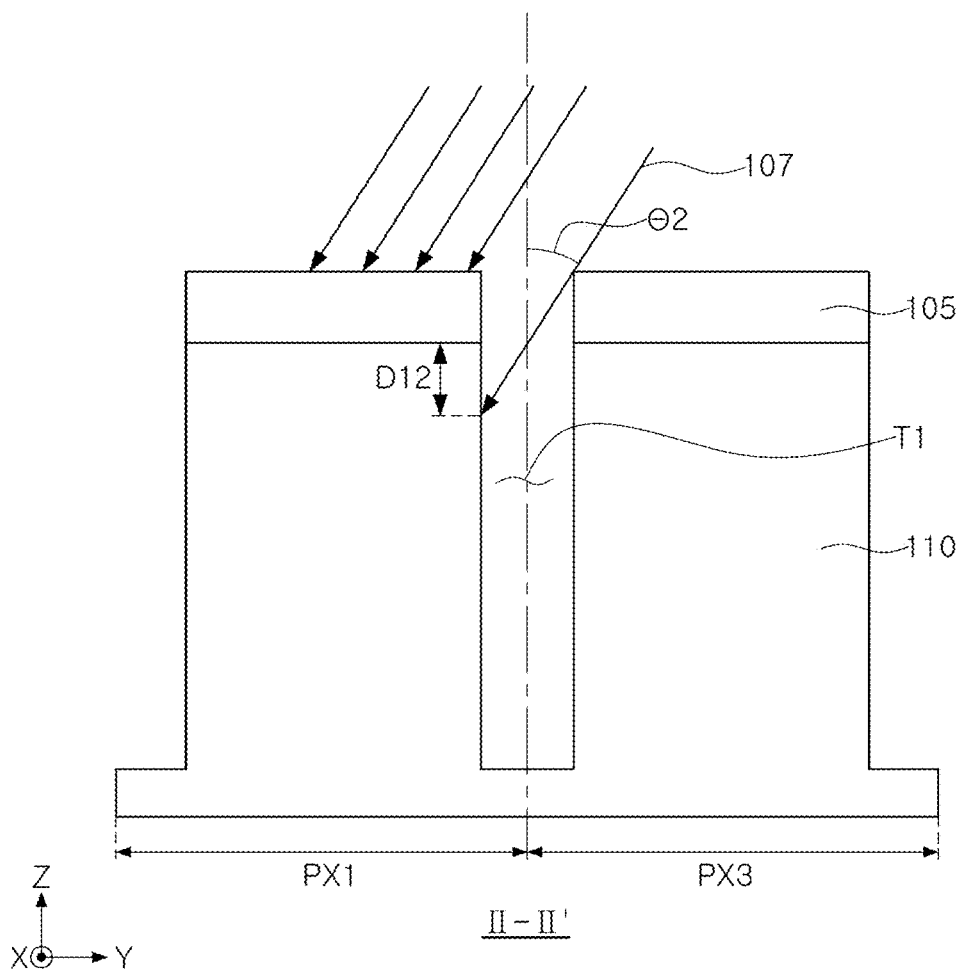
Figure 13C:
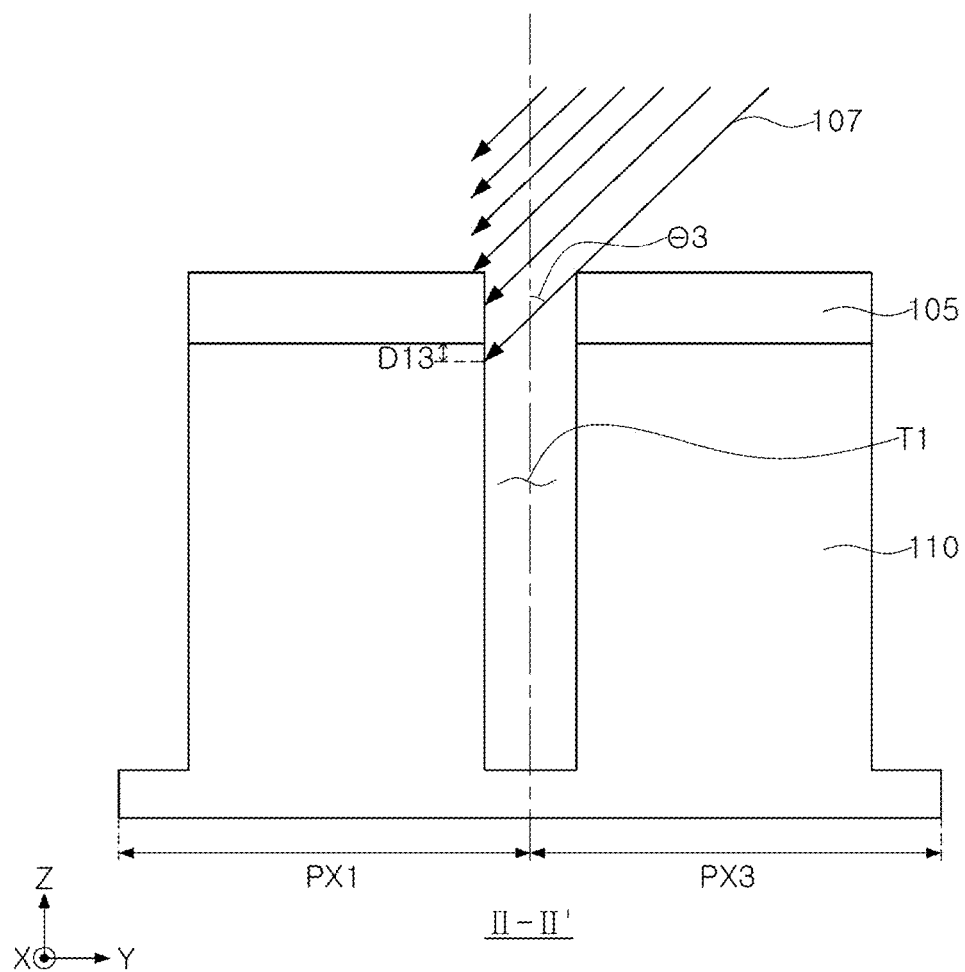
Figure 14A:
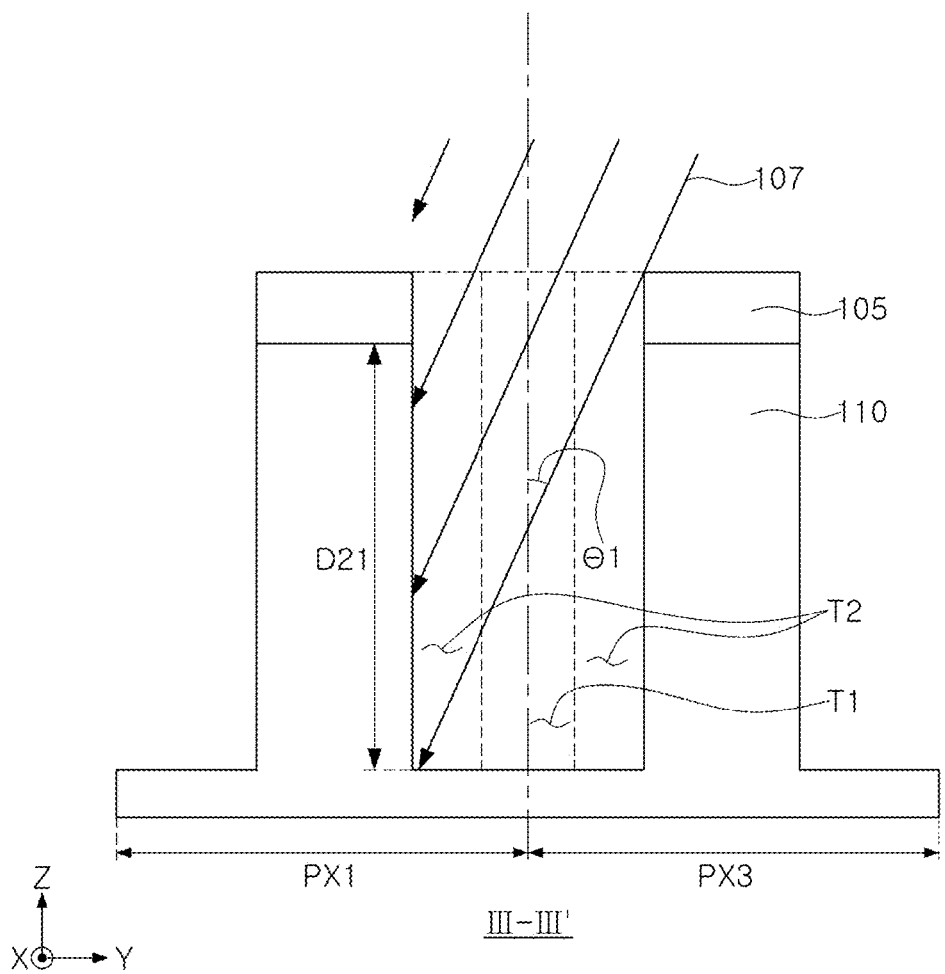
FIGS. 14A to 14C are cross-sectional diagrams of stages in a method of manufacturing an image sensor according to an example embodiment of the present disclosure.
Figure 14B:
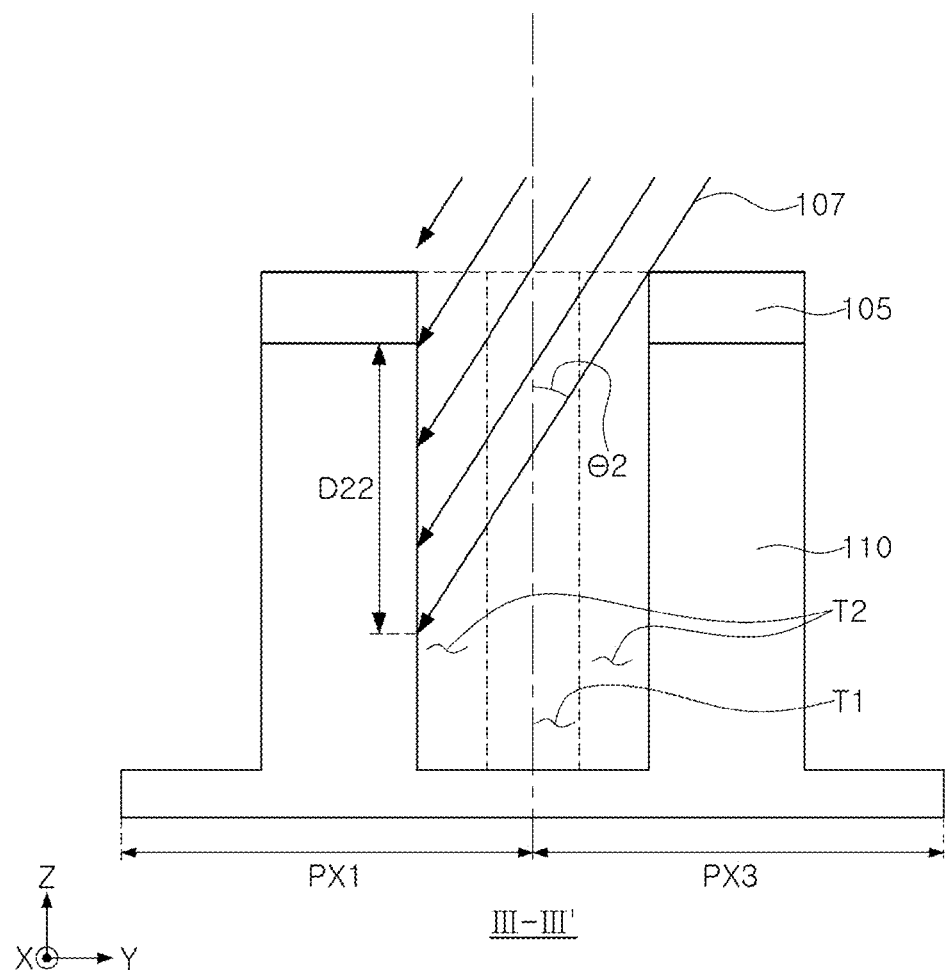
Figure 14C:
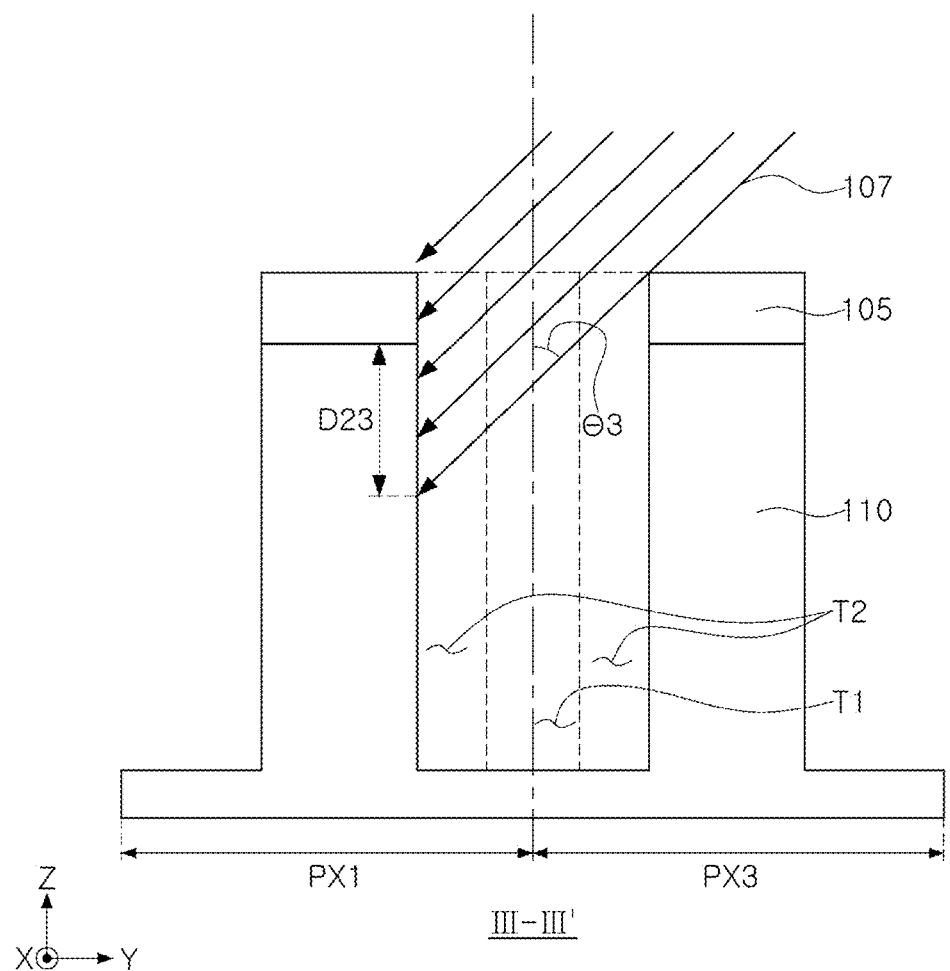

FIGS. 13A to 13C are cross-sectional diagrams illustrating the image sensor 100 in FIG. 2 taken along line II-II', and the cross-sectional diagrams include only an area of the first trench T1. FIGS. 14A to 14C are cross-sectional diagrams illustrating the image sensor 100 in FIG. 2 taken along line III-III', and the cross-sectional diagrams include an area of the first trenches T1 and the second trenches T2 consecutively disposed.

Referring to FIG. 13A, the beam 107 incident onto the substrate 110 through the first trench T1 may have a first angle θ1 with respect to the first direction, i.e., with respect to the z direction. For example, the beam 107 may form a doped layer by implanting impurities into the substrate 110. A doped layer may be formed on the substrate 110 adjacent to the first trench T1 other than the upper surface of the substrate 110 by the first mask layer 105 formed on a portion of the upper surface of the substrate 110, e.g., the doped layer may be formed on inner sidewalls of the first trench T1. However, an example embodiment thereof is not limited thereto, and the doped layer may be formed on at least a portion of the upper surface of the substrate 110. The beam 107 incident at the first angle θ1 may reach a depth D11, e.g., as measured from the second surface 112 of the substrate 110 along the first direction (i.e., z direction).

Referring to FIGS. 13B and 13C, the beam 107 incident onto the substrate 110 through the first trench T1 may have a second angle θ2 and a third angle θ3 with the first direction. The beam 107 incident at the second angle θ2 and the third angle θ3 in the process of manufacturing the image sensor illustrated in FIGS. 13B and 13C may reach depths D12 and D13 as in the process of manufacturing the image sensor illustrated in FIG. 13A, respectively.

As an example, the first angle θ1 may be smaller than the second angle θ2, and the second angle θ2 may be smaller than the third angle θ3. Accordingly, D11 may be greater than D12, and D12 may be greater than D13. In other words, as the angle between the beam 107 incident onto the substrate 110 through the first trench T1 and the first direction decreases, the beam 107 may reach a deeper position in the substrate 110, and the doped layer may be formed to a deeper position.

FIGS. 14A to 14C are diagrams corresponding to FIGS. 13A to 13C, respectively. As described above, since FIGS. 14A to 14C are cross-sectional views along line of FIG. 2, the illustrated trench reflects combined first and second trenches T1 and T2. That is, the center dashed region refers to a portion of the first trench T1 surrounding each of the pixels PX1 and PX3, while peripheral portions of the first trench T1 (i.e., portions on opposite sides of the first trench T1 between the center dashed region and a corresponding portion of the substrate 110) refers to portions of the second trenches T2 extending from the first trench T1, e.g., the first and second trenches T1 and T2 may be in fluid communication with each other.

As an example, referring to FIG. 14A, the beam 107 incident onto the substrate 110 through the first trench T1 and the second trenches T2 may have the first angle θ1 with the first direction. For example, the beam 107 may form the doped layer by implanting impurities into the substrate 110, and the doped layer may be formed on the substrate 110 adjacent to the second trenches T2 other than the upper surface of the substrate 110 by the first mask layer 105 formed on a portion of the upper surface of the substrate 110. However, an example embodiment thereof is not limited thereto, and the doped layer may be formed on at least a portion of the upper surface of the substrate 110. The beam 107 incident at the first angle θ1 may reach a depth D21, e.g., from the second surface of the substrate 110.

Similarly, referring to FIGS. 14B and 14C, the beam 107 incident onto the substrate 110 through the first trench T1 and the second trenches T2 may have the second angle θ2 and the third angle θ3 with the first direction. The beam 107 incident at the second angle θ2 and the third angle θ3 in the process of manufacturing the image sensor illustrated in FIGS. 14B and 14C may reach depths D22 and D23 as in the process of manufacturing the image sensor illustrated in FIG. 14A.

Since the width of the first trench T1 alone in the third direction (e.g., y direction in FIGS. 13A-13C) is smaller than the combined width in the third direction of the consecutively arranged first and second trenches T1 and T2 (e.g., y direction in FIGS. 14A-14C), D11 may be smaller than D21. Similarly, D12 may be smaller than D22, and D13 may be smaller than D23. In other words, when impurities are implanted into the substrate 110 by the beam 107 incident at a predetermined angle, the depth to which impurities are implanted in the area adjacent to the second trenches T2 may be greater than the depth to which impurities are implanted in the area adjacent to the first trench T1. For example, an incident angle of the beam 107 on the substrate 110 may be adjusted, e.g., by changing the tilt angle, to simultaneously irradiate the entire substrate 110, so that a depth (e.g., and doping concentration) of the beam 107 incident through a region including only the first trench T1 may be substantially smaller than a depth of the beam 107 incident through a region including the combined first and second trenches T1 and T2 (e.g., due to the larger width of the combined first and second trenches T1 and T2).

Figure 15:
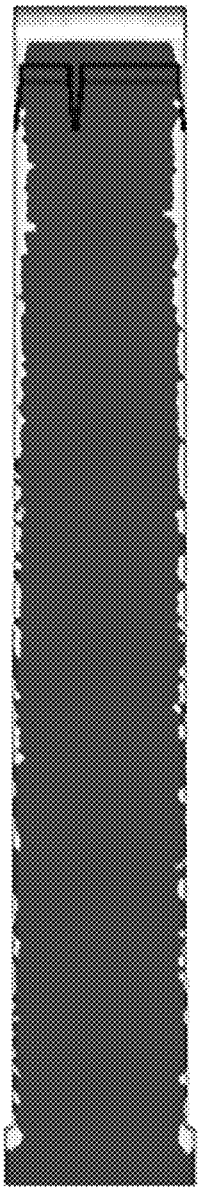
FIGS. 15A to 15C are diagrams illustrating a result of simulation of an image sensor according to an example embodiment of the present disclosure.
Figure 15B:
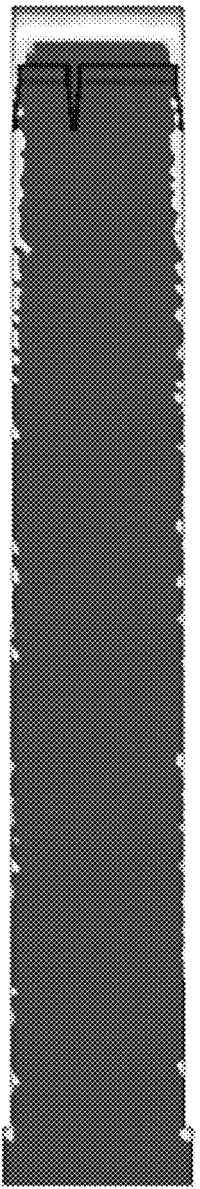
Figure 15C:
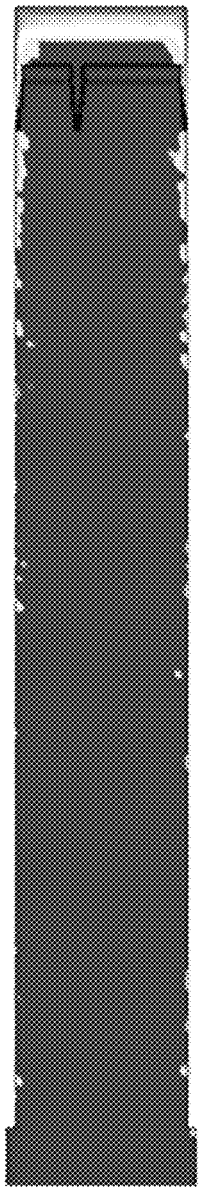

FIGS. 15A to 16C are diagrams illustrating a result of simulation of an image sensor according to an example embodiment. FIGS. 15A to 15C illustrate results of simulation corresponding to the method of manufacturing the image sensor described with reference to FIGS. 13A to 13C.

Figures 16, 16B, 16C:
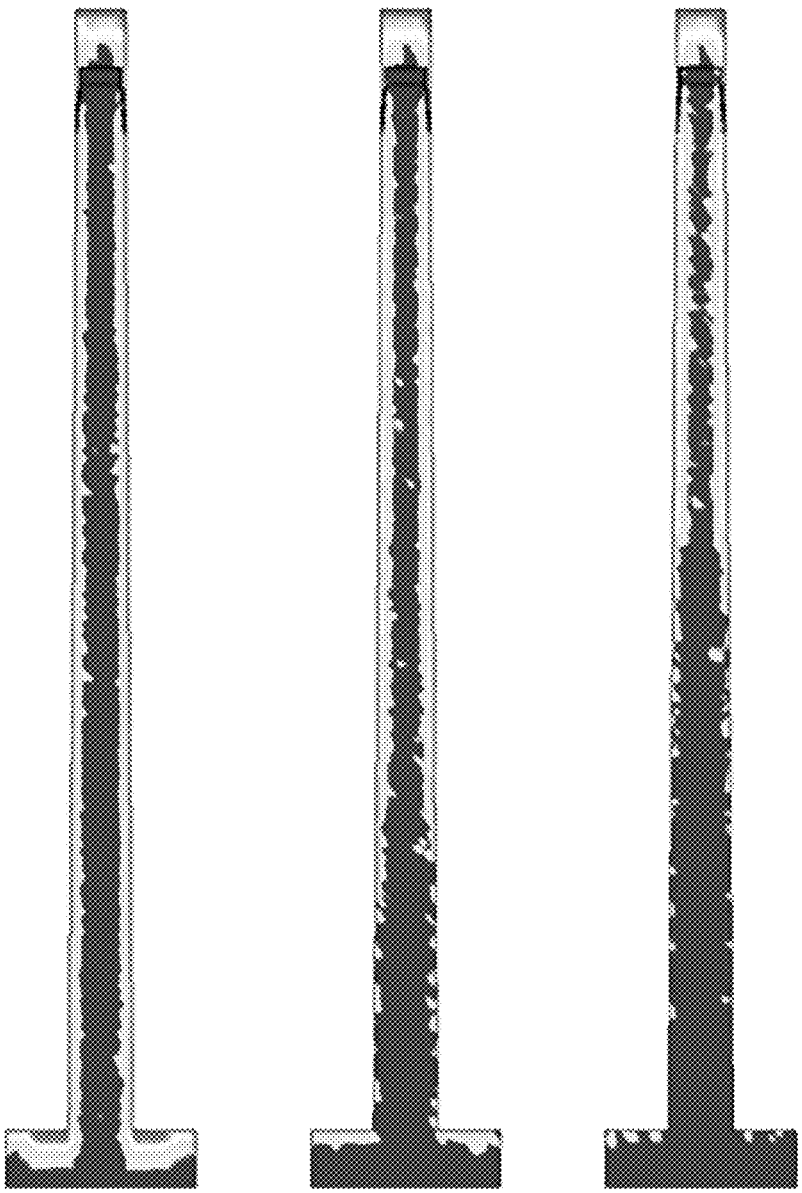

FIGS. 16A to 16C illustrate results of simulation corresponding to the method of manufacturing the image sensor described with reference to FIGS. 14A to 14C. It is noted that in FIGS. 15A through 16C, the substrate is indicated in black, while the white regions, e.g., stains, on the substrate refer to doped regions.

Referring to FIGS. 15A to 15C, it is indicated that, when a beam is incident onto the substrate through a region including only the first trench, the depth which the beam reaches increases, as the incident angle of the beam decreases. The deeper the depth of the beam, the deeper the depth of the formed doped layer. However, an example embodiment thereof is not limited thereto.

Similarly, referring to FIGS. 16A to 16C, it is indicated that, when the beam is incident into the substrate through a region including the first trench and the second trench, the depth which the beam reaches increases, the incident angle of the beam decreases. The deeper the depth at which the beam reaches, the deeper the depth of the formed doped layer may be. However, an example embodiment thereof is not limited thereto.

Referring to FIGS. 15A and 16A, 15B and 16B, and 15C and 16C, respectively, when impurities are implanted into the substrate by a beam incident at a predetermined angle, the depth to which impurities are implanted in the area adjacent to the second trenches T2 (FIGS. 16A-16C) may be greater than the depth to which impurities are implanted in the area adjacent to the first trench T1 (FIGS. 15A-15C). Also, it is indicated that, when impurities are implanted into the substrate by a beam incident at a predetermined angle, the concentration of the impurities implanted in the area adjacent to the second trench is higher (FIGS. 16A-6C) than the concentration of the impurities implanted in the area adjacent to the first trench (FIGS. 15A-15C). This example may correspond to the graphs illustrated in FIGS. 7A and 8A.

Figure 17A:
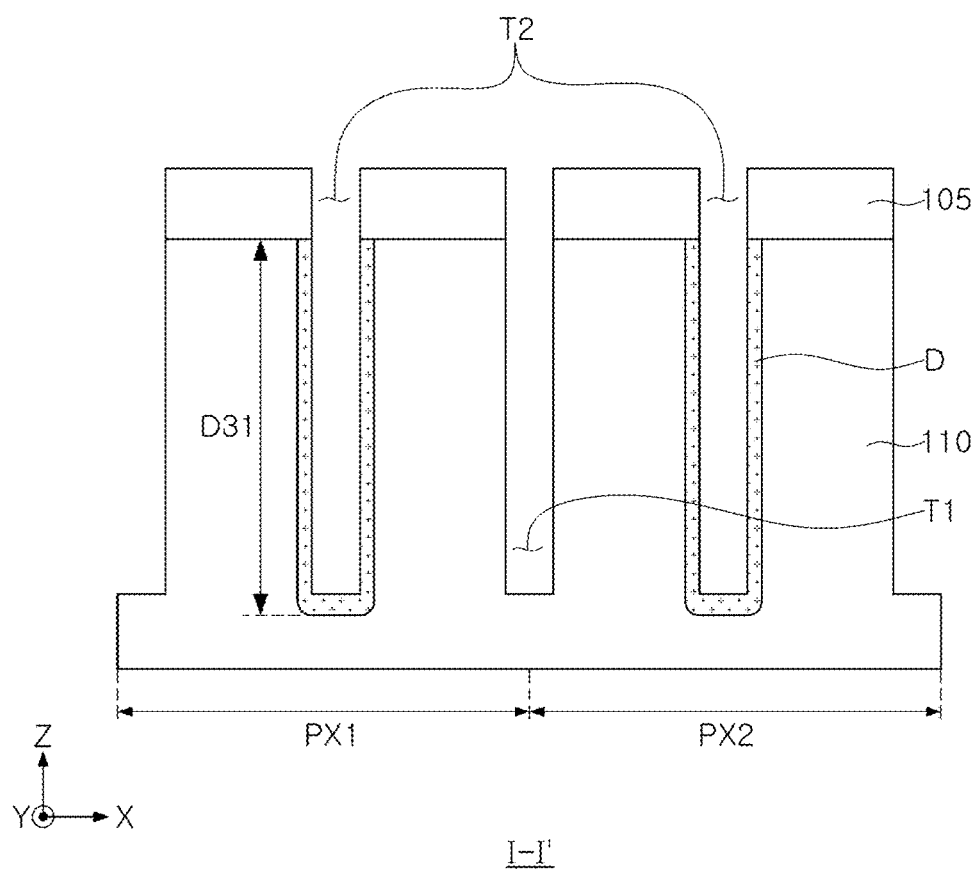
FIGS. 17A to 17C are cross-sectional diagrams illustrating doping in an image sensor according to an example embodiment of the present disclosure.
Figure 17B:
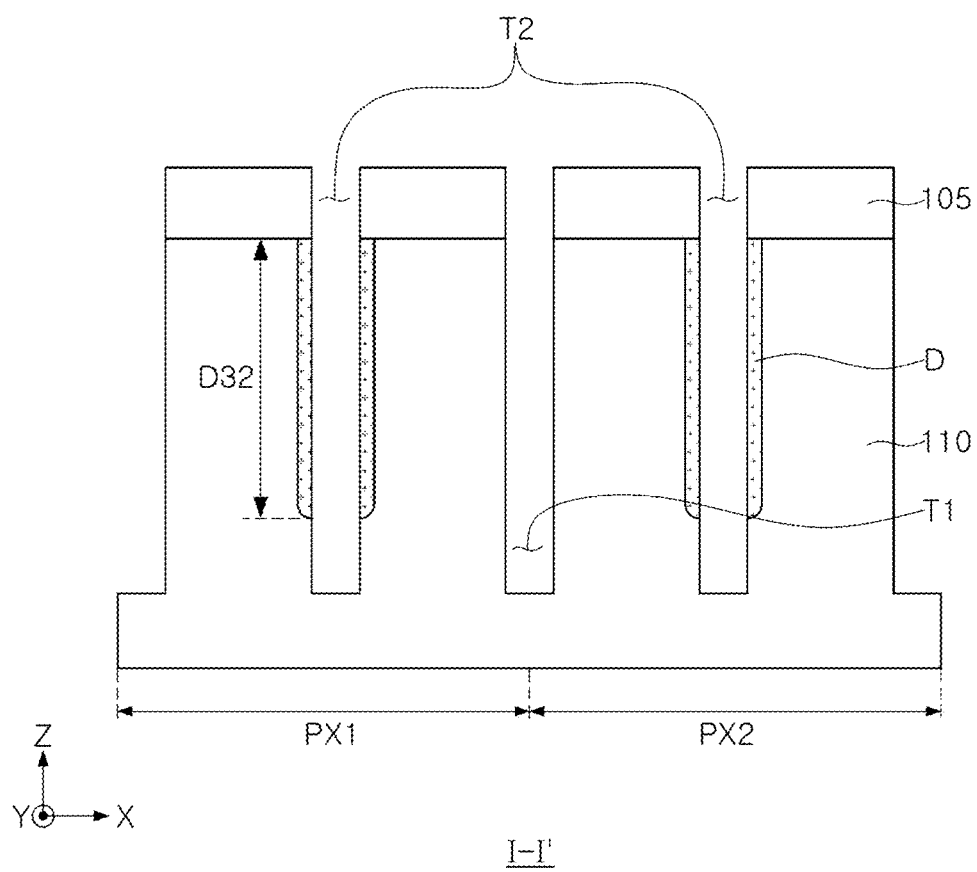
Figure 17C:
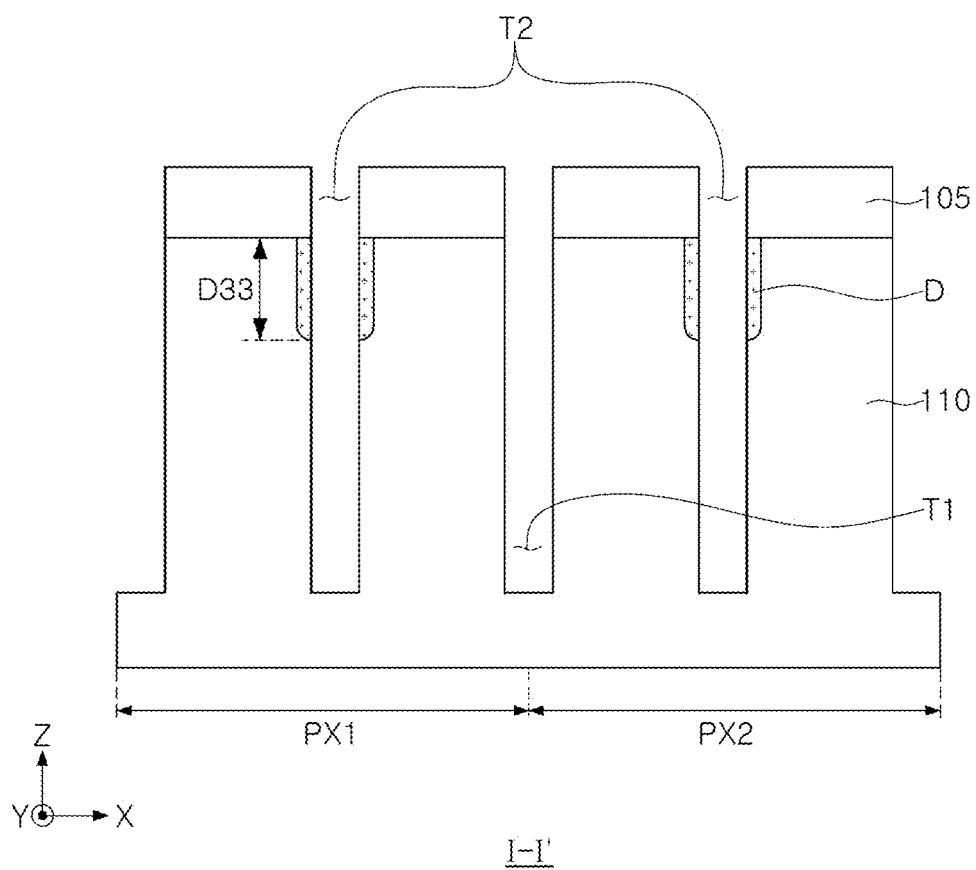

FIGS. 17A to 17C are cross-sectional diagrams illustrating doping in an image sensor according to an example embodiment. FIGS. 17A to 17C are diagrams illustrating the doped layer D formed by the method of manufacturing the image sensor illustrated in FIGS. 14A to 14C. As an example, FIGS. 17A to 17C are cross-sectional diagram illustrating the image sensor 100 in FIG. 2. FIGS. 17A to 17C illustrate only the doped layers D doped through the second trenches T2, but an example embodiment thereof is not limited thereto. The image sensor may further include a layer doped through the first trench T1.

Referring to FIGS. 17A to 17C, the beam 107 incident into the substrate 110 through the second trenches T2 may have a first angle θ1, a second angle θ2, and a third angle θ3 with the first direction. As described above, the first angle θ1 may be smaller than the second angle θ2, and the second angle θ2 may be smaller than the third angle θ3.

Referring to FIGS. 14A to 14C, in each example, depths D21, D22, and D23, reached by the beam 107 may correspond to depths D31, D32, and D33 of the doped layer D in FIG. 17A to FIGS. 17A to 17C, respectively. In other words, D31 may be greater than D32, and D32 may be greater than D33. However, D21, D22, and D23 and D31, D32, and D33 may not be the same. For example, as the surrounding of the internal area of the substrate 110 to which the beam reaches is doped, the doped layer D may be formed deeper than the depth to which the beam 107 reaches. However, an example embodiment thereof is not limited thereto.

Figure 18:
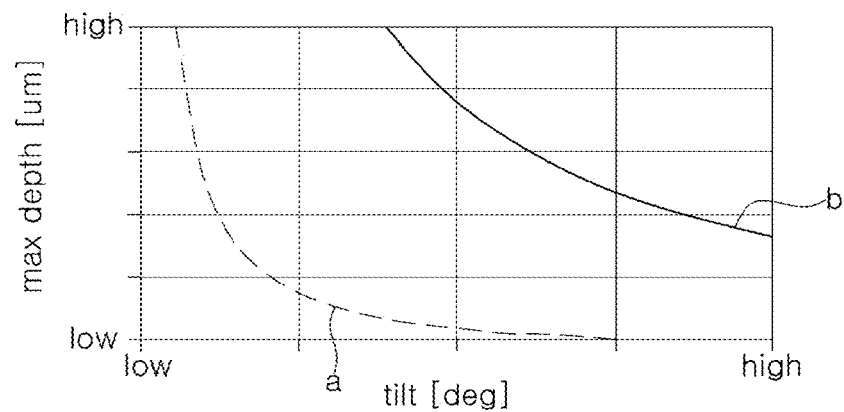
FIG. 18 is a diagram illustrating doping in an image sensor according to an example embodiment of the present disclosure.

FIG. 18 is a diagram illustrating doping in an image sensor according to an example embodiment.

Referring to FIG. 18, in the IIP process, the greater the depth of the internal area of the substrate to which impurities are implanted, the greater the incident angle of the beam may be. Even when the beam is incident at the same incident angle, the maximum doping depths in the portion in which the second trench is formed and the portion in which the second trench is not formed may be different. As an example, graph "a" indicates an example in which the maximum depth of the doping was significantly small when the incident angle is equal to or greater than a predetermined value, and the beam may be incident through the first trench. The example may correspond to the method of manufacturing the image sensor illustrated in FIGS. 13A to 13C. Graph "b" indicates an example in which, when the doped layer is formed even at a relatively high incident angle, the beam may be incident through the second trench, and the example may correspond to the method of manufacturing the image sensor illustrated in FIGS. 14A to 14C. As an example, graphs a and b illustrated in FIG. 18 may indicate results of the method of manufacturing the image sensor according to an example embodiment described with reference to FIGS. 9A to 17C.

The doped layer formed by the IIP process may form a barrier area having a predetermined potential between the two doped layers. As the doped layer formed in the area adjacent to the first trench is different from the doped layer formed in the area adjacent to the second trench, the maximum potential of the barrier area with respect to a predetermined angle may be determined by the shape of the second trenches. For example, the distribution of the potential of the barrier area may be determined by the shape of the second trenches.

Figure 19A:
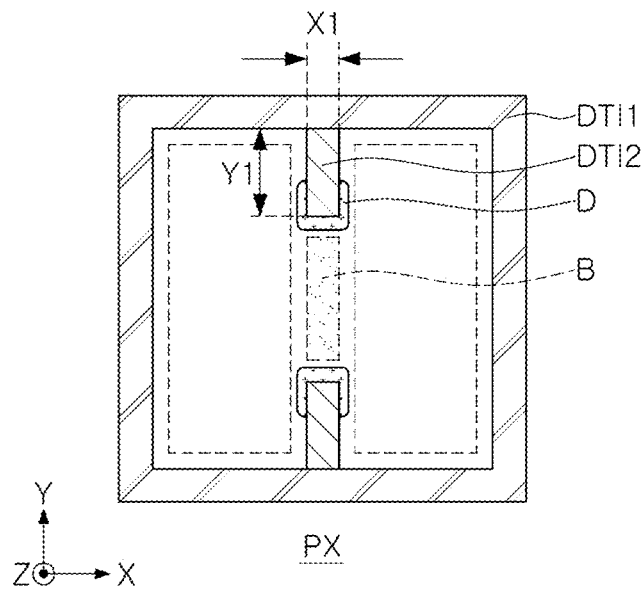
FIGS. 19A and 19B are diagrams illustrating a second device isolation film included in an image sensor according to an example embodiment of the present disclosure.
Figure 19B:
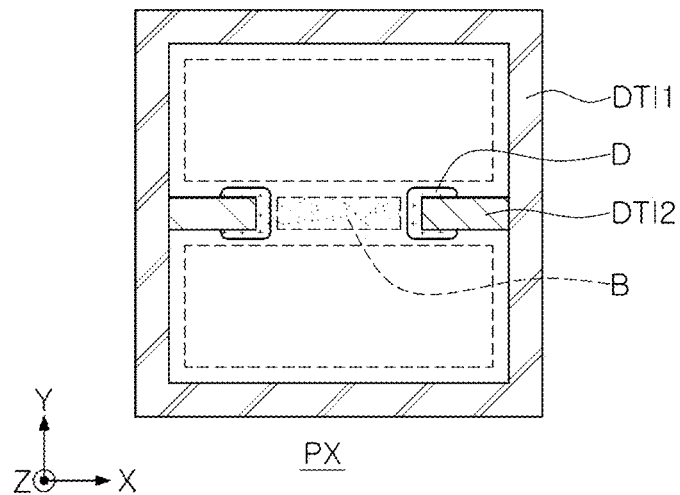

FIGS. 19A and 19B are diagrams illustrating a second device isolation film included in an image sensor according to an example embodiment. FIGS. 19A and 19B illustrate a difference according to an extending direction of the second device isolation film DTI2 in the method of manufacturing an image sensor in an example embodiment.

Referring to FIG. 19A, in each pixel region PX, the second device isolation film DTI2 may extend in the third direction (y direction). In this case, the beam incident in the IIP process included in the process of manufacturing the image sensor may be tilted and incident in the third direction. For example, the beam may be perpendicular to the second direction and may have a predetermined angle with the first direction, e.g., the beam may be incident on a surface perpendicular to the second direction at a predetermined angle with respect to the first direction.

Referring to FIG. 19B, in each pixel region PX, the second device isolation film DTI2 may extend in the second direction (x direction). In this case, the beam incident in the IIP process included in the process of manufacturing the image sensor may be tilted and incident in the second direction, e.g., the beam may be tilted in the second direction toward facing surfaces of the second device isolation film DTI2 (which are spaced apart from each other in the second direction) to be incident on the facing surfaces of the second device isolation film DTI2. For example, the beam may be perpendicular to the third direction and have a predetermined angle with the first direction. In other words, the beam incident in the IIP process may be incident in the direction of the internal area of each pixel region PX, and may be tilted and incident in the extending direction of the second device isolation film DTI2, e.g., to be incident on facing surfaces of the second device isolation film DTI2. However, an example embodiment thereof is not limited thereto.

Referring to FIGS. 19A and 19B, when the position of the second device isolation film DTI2 changes, the position of the formed doped layer D may also change. For example, the doped layer D may be formed on a substrate adjacent to the second device isolation film DTI2. As the position in which the doped layer D is formed changes, the shape of the formed barrier area BA may also change. However, an example embodiment thereof is not limited thereto, and the controlling the movement of electric charges using the barrier area BA may be implemented.

Figure 20A:
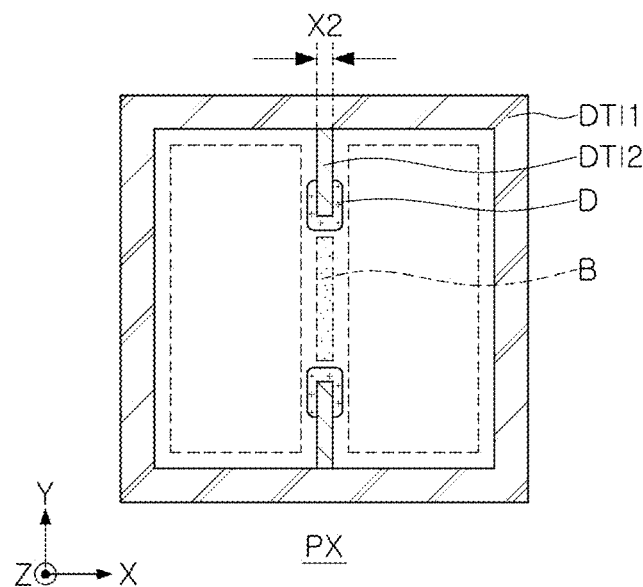
FIGS. 20A and 20B are diagrams illustrating a second device isolation film included in an image sensor according to an example embodiment of the present disclosure.
Figure 20B:
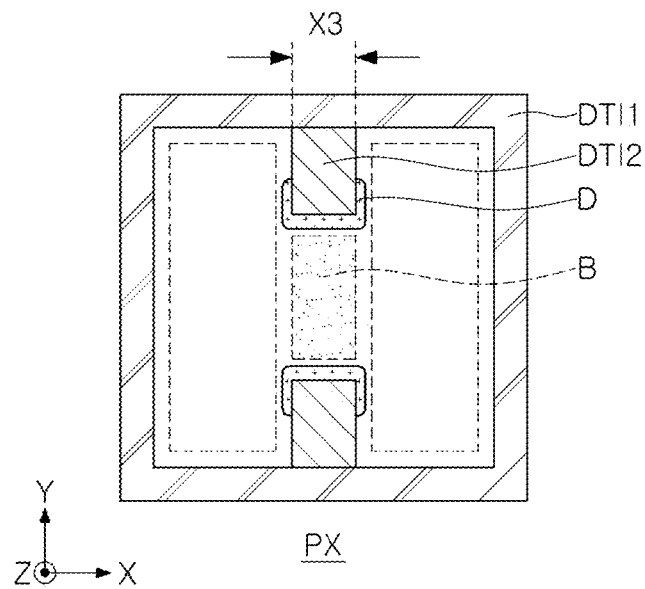

FIGS. 20A and 20B are diagrams illustrating a second device isolation film included in an image sensor according to an example embodiment. FIGS. 20A and 20B illustrate a difference according to a length of the second device isolation film DTI2 in a second direction in the method of manufacturing an image sensor according to an example embodiment.

The second device isolation film DTI2 included in the pixel region PX of the image sensor illustrated in FIG. 19A may have a length X1 in the second direction. Referring to FIGS. 20A and 20B, the second device isolation film DTI2 included in the pixel region PX of the image sensor may have lengths X2 and X3 in the second direction. For example, X2 may be less than X1, and X3 may be greater than X1. When the size of the second device isolation film DTI2 changes, the size of the formed doped layer D may also change. For example, the doped layer D may be formed on a substrate adjacent to the second device isolation film DTI2. Accordingly, as the size of the doped layer D changes, the shape, e.g., length in the second direction, of the barrier area BA formed may also change, e.g., the length of the barrier area BA may equal the length of the second device isolation film DTI2.

As an example, the barrier area BA included in the pixel region PX of the image sensor illustrated in FIG. 20A may have a relatively short length corresponding to X2 in the second direction. The barrier area BA included in the pixel region PX of the image sensor illustrated in FIG. 20B may have a relatively long length corresponding to X3 in the second direction. Accordingly, the length of the second device isolation film DTI2 in the second direction may determine a distribution of the potential of the barrier area BA in the second direction.

Figure 21A:
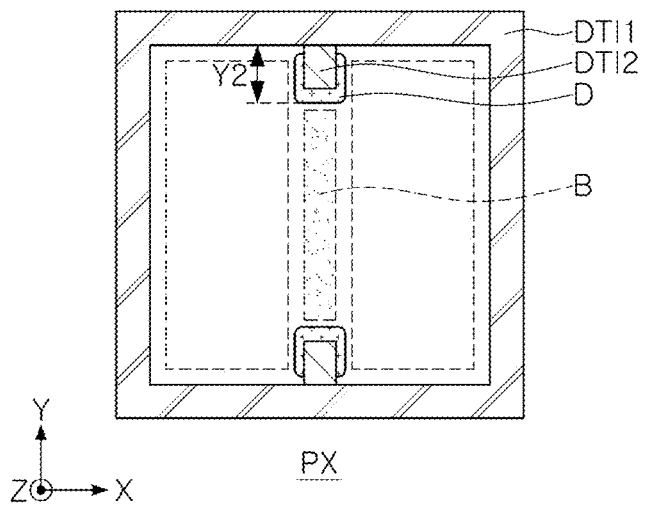
FIGS. 21A and 21B are diagrams illustrating a second device isolation film included in an image sensor according to an example embodiment of the present disclosure.
Figure 21B:
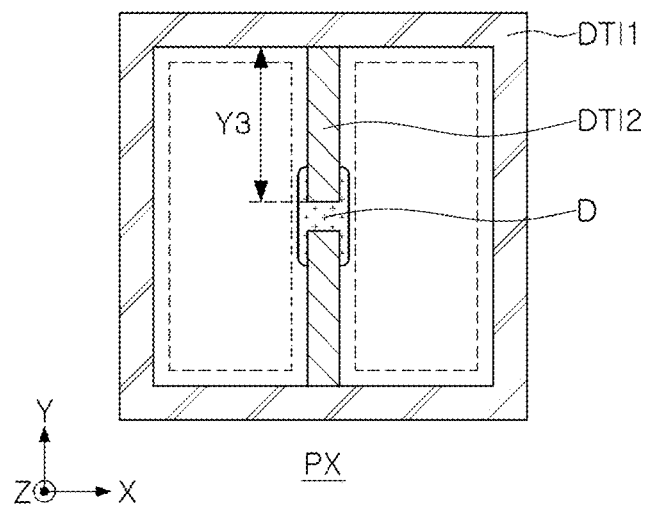

FIGS. 21A and 21B are diagrams illustrating a second device isolation film included in an image sensor according to an example embodiment. FIGS. 21A and 21B illustrate a difference according to a length of the second device isolation film DTI2 in a third direction in a method of manufacturing an image sensor according to an example embodiment.

The second device isolation film DTI2 included in the pixel region PX of the image sensor illustrated in FIG. 19A may have a length Y1 in the third direction. Referring to FIGS. 21A and 21B, the second device isolation film DTI2 included in the pixel region PX of the image sensor may have lengths Y2 and Y3 in the third direction. For example, Y2 may be smaller than Y1, and Y3 may be larger than Y1. When the size of the second device isolation film DTI2 changes, the shape, e.g., length in the third direction, of the formed doped layer D may also change, and the shape of the formed barrier area BA may also change.

As an example, the doped layer D included in the pixel region PX of the image sensor illustrated in FIG. 21A may be formed through a second trench having a relatively short length corresponding to Y2 in the third direction. For example, when a beam incident at a predetermined angle is incident through the second trench having a relatively short length, a maximum doping depth may decrease. Also, referring to FIG. 7A, the doping concentration of the doped layer D may also decrease. Accordingly, differently from the barrier area BA included in the pixel region PX illustrated in FIG. 19A, the barrier area BA included in the pixel region PX illustrated in FIG. 21A may have a maximum potential which may be relatively long in the third direction and small. However, an example embodiment thereof is not limited to the example illustrated in FIG. 21A. For example, the pixel region PX may include a second device isolation film DTI2 having an extremely short size.

The doped layer D included in the pixel region PX of the image sensor illustrated in FIG. 21B may be formed through the second trench having a relatively long length corresponding to Y3 in the third direction. For example, when a beam incident at a predetermined angle is incident through the second trench having a relatively long length, the maximum doping depth may increase. Accordingly, the doping concentration of the doped layer D may increase, and differently from the barrier area BA included in the pixel region PX illustrated in FIG. 19A, the barrier area BA having a maximum potential which may be relatively short in the third direction and large may be included. However, an example embodiment thereof is not limited thereto, and the second device isolation film DTI2 may extend to penetrate the pixel region PX in the third direction. Also, even when the pixel region PX is not penetrated in the third direction, the doped layers may be connected to each other such that the pixel region PX may not include the barrier area BA.

In the method of manufacturing an image sensor in an example embodiment, the length of the second device isolation film DTI2 in the third direction corresponding to the length of the second trench in the third direction may determine a position of the barrier area BA and the maximum potential along with the incident angle of the beam incident in the IIP process. According to the aforementioned example, the concentration of impurities implanted into the substrate may be controlled based on the length of the second trench in the third direction and the incident angle of the beam in the IIP process.

Figure 22A:
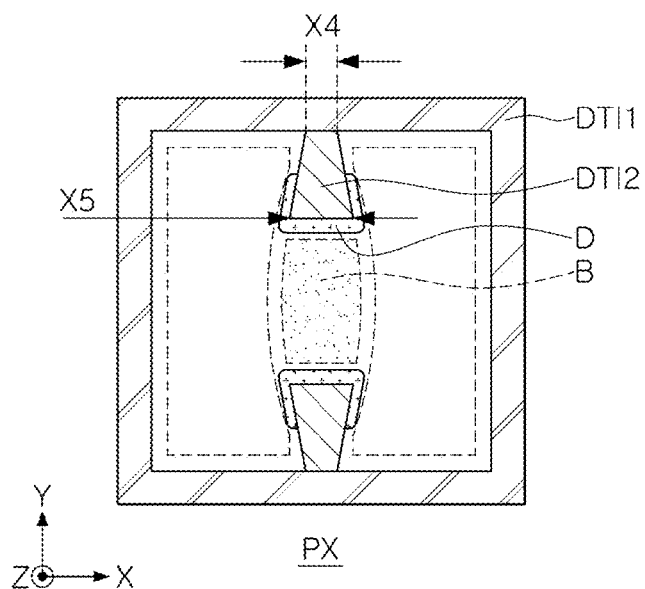
FIGS. 22A and 22B are diagrams illustrating a second device isolation film included in an image sensor according to an example embodiment of the present disclosure.
Figure 22B:
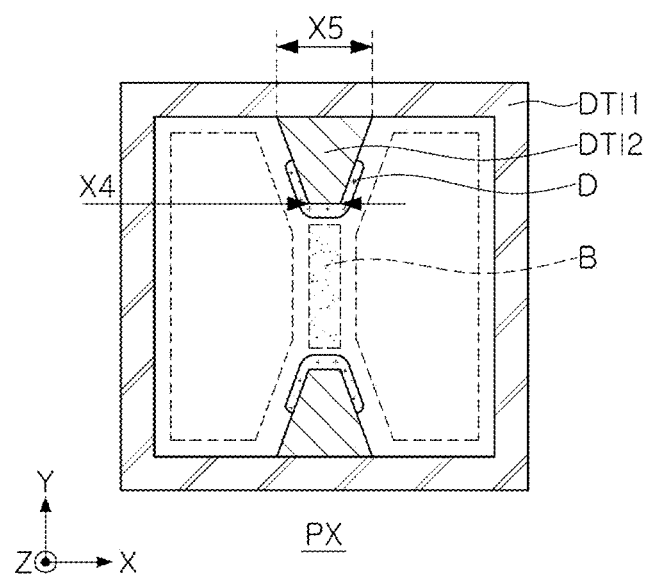
Figure 23:
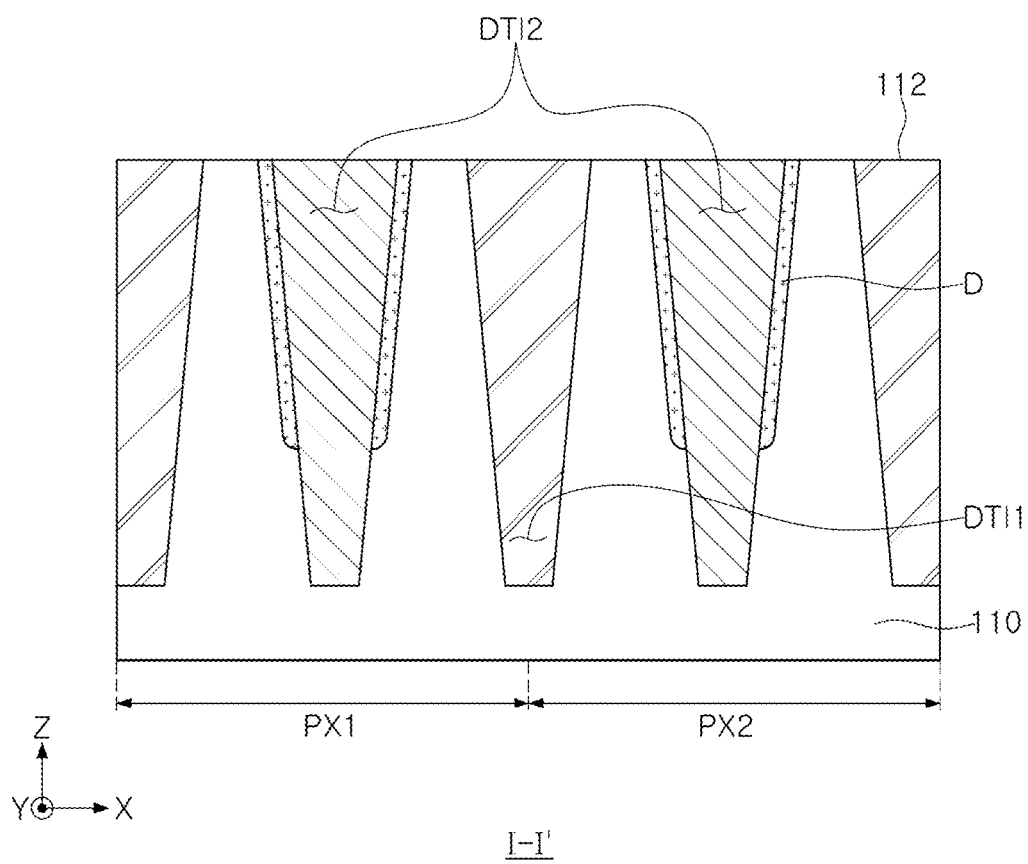
FIG. 23 is a diagram illustrating a second device isolation film included in an image sensor according to an example embodiment of the present disclosure.

FIGS. 22A and 22B are diagrams illustrating a second device isolation film included in an image sensor according to an example embodiment. FIG. 23 is a diagram illustrating a second device isolation film included in an image sensor according to an example embodiment. FIGS. 22A to 23 illustrate a difference according to a shape of a second device isolation film DTI2 in the method of manufacturing an image sensor according to an example embodiment.

Referring to FIGS. 22A and 22B, a second device isolation film DTI2 may have different lengths X4 and X5 in the second direction with respect to two different positions in the third direction. For example, the second device isolation film DTI2 included in the pixel region PX of the image sensor illustrated in FIG. 22A may have a length X4 in a position adjacent to the first device isolation film DTI1, and may have a length X5, greater than X4, in the position distanced from the first device isolation film DTI1. The second device isolation film DTI2 included in the pixel region PX of the image sensor illustrated in FIG. 22B may have a length X5 in a position adjacent to the first device isolation film DTI1, and may have a length of X4 less than X5 in a position distanced from the first device isolation film DTI1. When the shape of the second device isolation film DTI2 changes, the shape of the formed doped layer D may also change accordingly, and the shape of the formed barrier area BA may also change, e.g., have a varying length in the second direction in FIG. 22A. However, an example embodiment thereof is not limited thereto.

FIG. 23 illustrate a cross-sectional surface of the image sensor corresponding to the process illustrated in FIG. 11A in the method of manufacturing an image sensor according to an example embodiment. Referring to FIG. 23, the second device isolation film DTI2 may have different lengths in the second direction with respect to two different positions in the first direction. As an example, the second device isolation film DTI2 included in the image sensor illustrated in FIG. 23 may have a smaller, e.g., decreasing, length in the second direction as the depth from the second surface 112 of the substrate 110 increases. When the shape of the second device isolation film DTI2 changes, characteristics of the doped layer D and the barrier area may change as in the aforementioned example embodiments. However, an example embodiment thereof is not limited to the example illustrated in FIG. 23. As described above, the shape of the second device isolation film DTI2 may determine the distribution of the potential of the barrier area BA.

Figure 24:
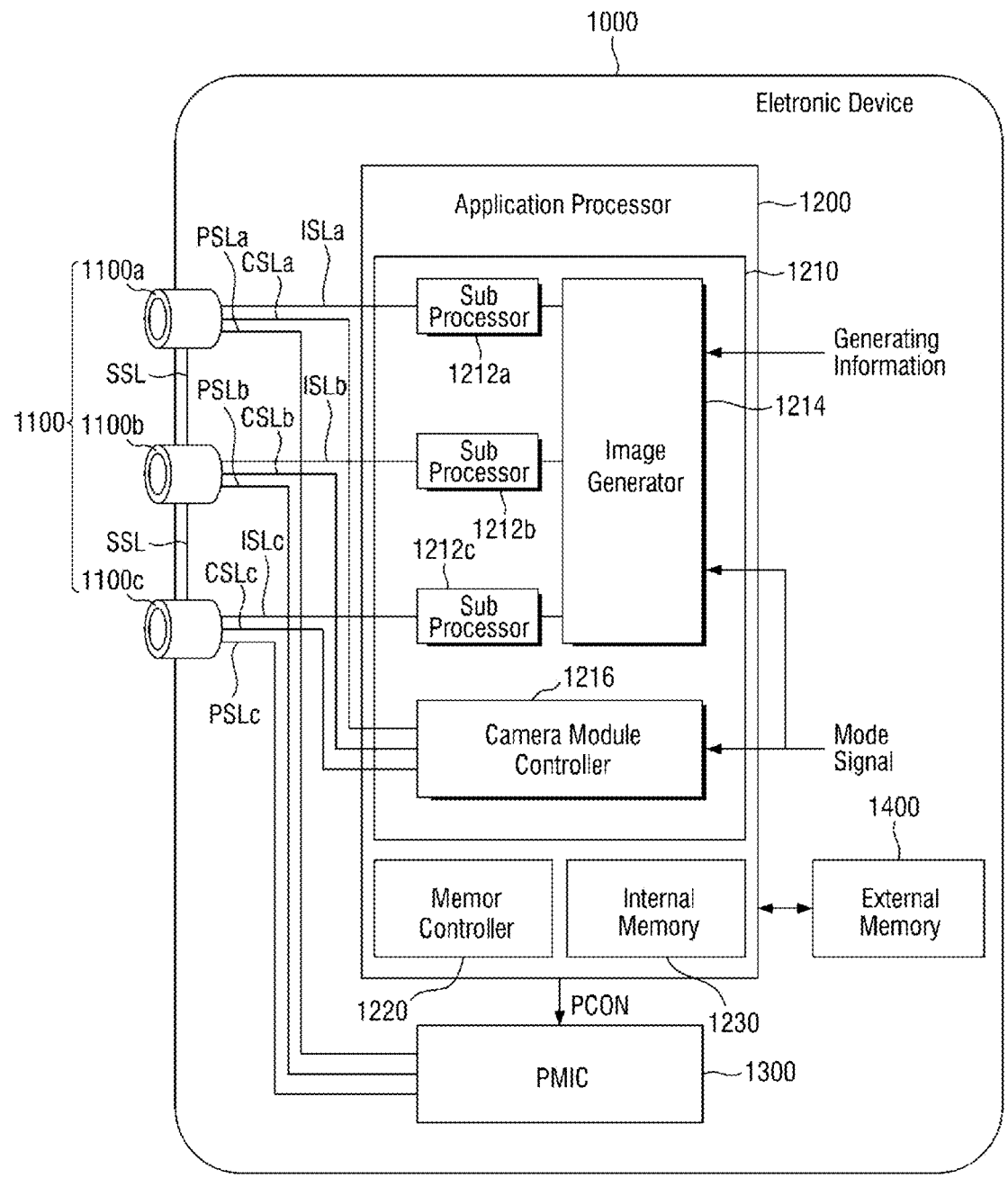
FIGS. 24 and 25 are diagrams illustrating an electronic device including an image sensor according to an example embodiment of the present disclosure.
Figure 25:
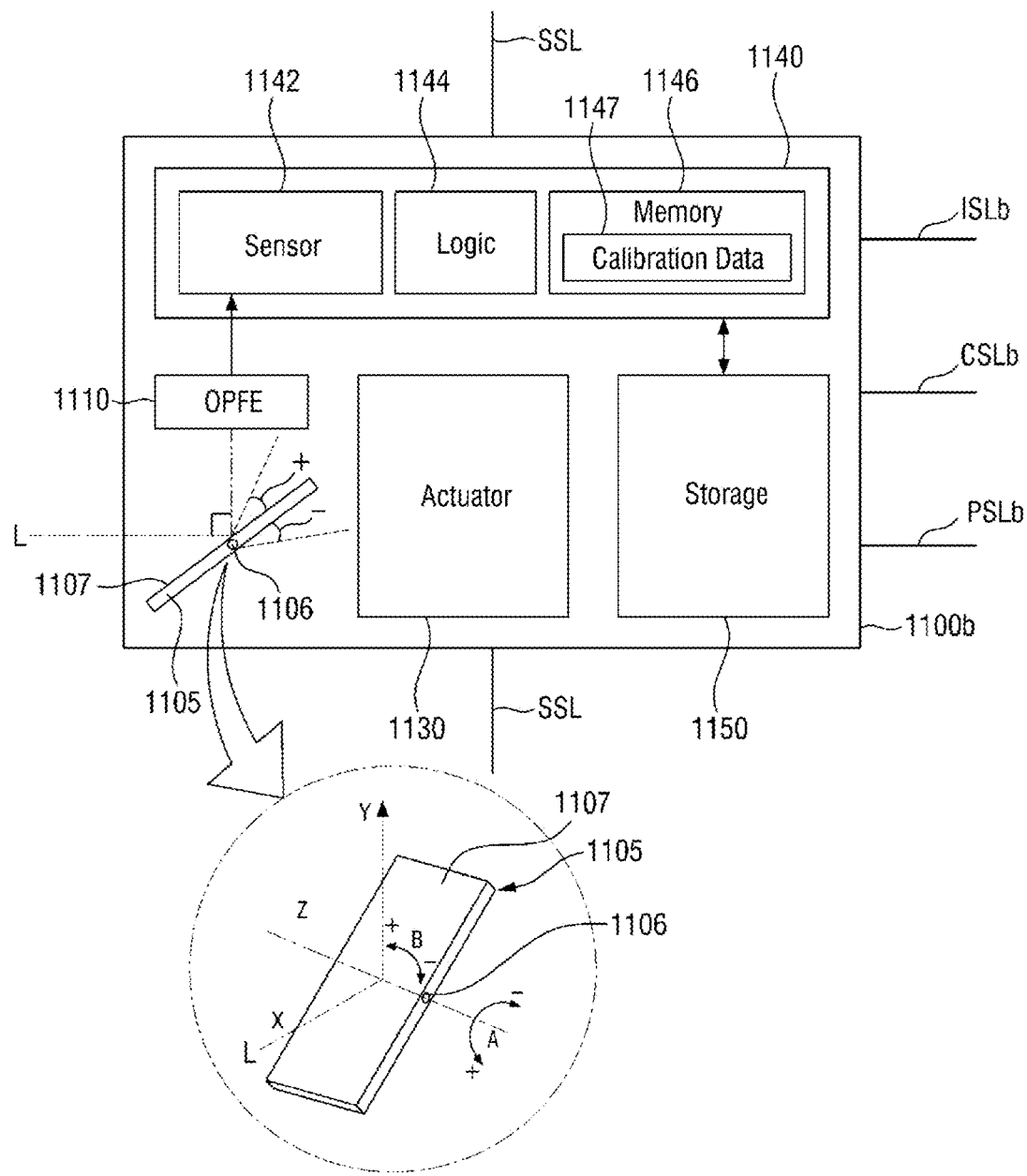

FIGS. 24 and 25 are diagrams illustrating an electronic device including an image sensor according to an example embodiment.

Referring to FIG. 24, an electronic device 1000 may include a camera module group 1100, an application processor 1200, a power management integrated circuit (PMIC) 1300, and a storage 1400.

The camera module group 1100 may include a plurality of camera modules 1100a, 1100b, and 1100c. Although the drawings illustrate an example embodiment in which three camera modules 1100a, 1100b, and 1100c are arranged, an example embodiment thereof is not limited thereto. In example embodiments, the camera module group 1100 may be modified to include only two camera modules. Also, in example embodiments, the camera module group 1100 may be modified to include n number of camera modules (n is a natural number equal to or greater than 4). Also, in an example embodiment, at least one of the plurality of camera modules 1100a, 1100b, and 1100c included in the camera module group 1100 may include the image sensor of the aforementioned example embodiments described with reference to FIGS. 1 to 23.

In the description below, the configuration of the camera module 1100b will be described in greater detail, and the description may also be applied to the other camera modules 1100a and 1100b according to an example embodiment.

Referring to FIG. 25, the camera module 1100b may include a prism 1105, an optical path folding element (OPFE) 1110, an actuator 1130, an image sensing device 1140, and a storage unit 1150.

The prism 1105 may include a reflective surface 1107 of a light reflective material to change a path of light L incident from the outside. In example embodiments, the prism 1105 may change the path of the light L incident in the second direction X in the third direction Y perpendicular to the second direction X. Also, the prism 1105 may rotate the reflective surface 1107 of a light reflective material in the direction A around a central axis 1106, or may rotate the central axis 1106 in the direction B to change the path of the incident light L incident in the second direction X in the third direction Y. In this case, the OPFE 1110 may also move in the first direction z perpendicular to the second direction X and the third direction Y.

In example embodiments, as illustrated, a maximum rotation angle of the prism 1105 in the A direction may be 15 degrees or less in the positive (+) A direction, and may be greater than 15 degrees in the negative (−) A direction. However, an example embodiment thereof is not limited thereto.

In example embodiments, the prism 1105 may move by about 20 degrees, between 10 degrees and 20 degrees, or between 15 degrees and 20 degrees in the positive (+) or negative (−) B direction, and the prism 1105 may move by the same angle in the positive (+) or negative (−) B direction or may move by a similar angle in a range of about 1 degree.

In example embodiments, the prism 1105 may move the reflective surface 1107 of a light reflective material in the first direction (e.g., the z direction) parallel to the extending direction of the central axis 1106.

The OPFE 1110 may include, e.g., an optical lens including m number of groups (where m is a natural number). The m number of lenses may move in the third direction Y to change an optical zoom ratio of the camera module 1100b. For example, when a basic optical zoom ratio of the camera module 1100b is Z, and m number of optical lenses included in the OPFE 1110 move, the optical zoom ratio of the camera module 1100b may be 3Z, 5Z, or 5Z or higher.

The actuator 1130 may move the OPFE 1110 or an optical lens (hereinafter, referred to as an optical lens) to a specific position. For example, the actuator 1130 may adjust the position of the optical lens such that the image sensor 1142 may be disposed at a focal length of the optical lens for accurate sensing.

The image sensing device 1140 may include an image sensor 1142, a control logic 1144 and a memory 1146. The image sensor 1142 may sense an image of a sensing target using light L provided through an optical lens. The control logic 1144 may control overall operation of the camera module 1100b. For example, the control logic 1144 may control the operation of the camera module 1100b according to a control signal provided through a control signal line CSLb.

The memory 1146 may store information necessary for operation of the camera module 1100b, such as calibration data 1147. The calibration data 1147 may include information necessary for the camera module 1100b to generate image data using light L provided from the outside. The calibration data 1147 may include, e.g., information on a degree of rotation, information on a focal length, information on an optical axis, and the like, described above. When the camera module 1100b is implemented as a multi-state camera of which a focal length changes depending on the position of the optical lens, the calibration data 1147 may include information on focal length values for each position (or each state) of the optical lens and autofocusing.

The storage unit 1150 may store image data sensed through the image sensor 1142. The storage unit 1150 may be disposed externally on the image sensing device 1140 and may be implemented to be stacked with a sensor chip forming the image sensing device 1140. In example embodiments, the storage unit 1150 may be implemented as an electrically erasable programmable read-only memory (EEPROM), but an example embodiment thereof is not limited thereto.

Referring to FIGS. 24 and 25, in example embodiments, each of the plurality of camera modules 1100a, 1100b, and 1100c may include the actuator 1130. Accordingly, each of the plurality of camera modules 1100a, 1100b, and 1100c may include the same or different calibration data 1147 according to operation of the actuator 1130 included therein.

In example embodiments, one camera module (e.g., 1100b) among the plurality of camera modules 1100a, 1100b, and 1100c may be implemented as a folded lens type camera module including the prism 1105 and OPFE 1110 described above, and the other camera modules (e.g., 1100*a* and 1100*b*) may be a vertical type camera module which does not include the prism 1105 and OPFE 1110, but an example embodiment thereof is not limited thereto.

In example embodiments, one camera module (e.g., 1100*c*) among the plurality of camera modules 1100*a*, 1100*b*, and 1100*c* may be implemented as a vertical-type depth camera which may extract depth information using, e.g., infrared (IR) light. In this case, the application processor 1200 may merge the image data provided from the depth camera with the image data provided from another camera module (e.g., the camera module 1100*a* or 1100*b*) and may generate a 3D depth image.

In example embodiments, at least two camera modules (e.g., 1100*a* and 1100*b*) among the plurality of camera modules 1100*a*, 1100*b*, and 1100*c* may have different fields of view. In this case, e.g., the optical lenses of at least two camera modules (e.g., 1100*a* and 1100*b*) among the plurality of camera modules 1100*a*, 1100*b*, and 1100*c*, may be different from each other, but an example embodiment thereof is not limited thereto.

Also, in example embodiments, fields of view of the plurality of camera modules 1100*a*, 1100*b*, and 1100*c* may be different from each other. In this case, the optical lenses included in each of the plurality of camera modules 1100*a*, 1100*b*, and 1100*c* may also be different from each other, but an example embodiment thereof is not limited thereto.

In example embodiments, the plurality of camera modules 1100*a*, 1100*b*, and 1100*c* may be configured to be physically isolated from each other. In other words, a sensing area of one image sensor 1142 may not be divided and used by the plurality of camera modules 1100*a*, 1100*b*, and 1100*c*, and an independent image sensor 1142 may be disposed in each of the plurality of camera modules 1100*a*, 1100*b*, and 1100*c*.

Referring back to FIG. 24, the application processor 1200 may include an image processing apparatus 1210, a memory controller 1220, and an internal memory 1230. The application processor 1200 may be implemented to be separated from the plurality of camera modules 1100*a*, 1100*b*, and 1100*c*. For example, the application processor 1200 and the plurality of camera modules 1100*a*, 1100*b*, and 1100*c* may be implemented to be separated from each other as separate semiconductor chips.

The image processing apparatus 1210 may include a plurality of sub-image processors 1212*a*, 1212*b*, and 1212*c*, an image generator 1214, and a camera module controller 1216.

The image processing apparatus 1210 may include a plurality of sub-image processors 1212*a*, 1212*b*, and 1212*c* corresponding to the number of the plurality of camera modules 1100*a*, 1100*b*, and 1100*c*.

Image data generated by each of the camera modules 1100*a*, 1100*b*, and 1100*c* may be provided to corresponding sub-image processors 1212*a*, 1212*b*, and 1212*c* through image signal lines ISLa, ISLb, and ISLc separated from each other. For example, image data generated by the camera module 1100*a* may be provided to the sub-image processor 1212*a* through an image signal line ISLa, the image data generated by the camera module 1100*b* may be provided to the sub-image processor 1212*b* through the image signal line ISLb, and the image data generated by the camera module 1100*c* may be provided to the sub-image processor 1212*c* through the image signal line ISLc. The image data transmission may be performed using, e.g., a camera serial interface (CSI) based on a mobile industry processor interface (MIPI), but an example embodiment thereof is not limited thereto.

In example embodiments, one sub-image processor may be arranged to correspond to a plurality of camera modules. For example, the sub-image processor 1212*a* and the sub-image processor 1212*c* may not be implemented to be separated from each other as illustrated, and may be implemented to be integrated into a single sub-image processor, and the image data provided by the camera module 1100*a* and the camera module 1100*c* may be selected through a selection device (e.g., a multiplexer) and may be provided to the integrated sub-image processor.

The image data provided to each of the sub-image processors 1212*a*, 1212*b*, and 1212*c* may be provided to the image generator 1214. The image generator 1214 may generate an output image using the image data provided by each of the sub-image processors 1212*a*, 1212*b*, and 1212*c* according to image generating information or a mode signal.

For example, the image generator 1214 may generate an output image by merging at least portions of the image data generated by the camera modules 1100*a*, 1100*b*, 1100*c* having different fields of view according to the image generating information or a mode signal. Also, the image generator 1214 may generate an output image by selecting one of the image data generated by the camera modules 1100*a*, 1100*b*, and 1100*c* having different fields of view according to image generation information or a mode signal.

In example embodiments, the image generating information may include a zoom signal or zoom factor. Also, in example embodiments, the mode signal may be, e.g., a signal based on a mode selected by a user.

When the image generating information is a zoom signal (zoom factor), and the camera modules 1100*a*, 1100*b*, and 1100*c* have different fields of view, the image generator 1214 may perform different operations depending on types of zoom signals. For example, when the zoom signal is a first signal, the image data output by the camera module 1100*a* may be merged with the image data output by the camera module 1100*c*, and an output image may be generated using the merged image signal and the image data output by the camera module 1100*b* which has not been used in the merging. When the zoom signal is a second signal different from the first signal, the image generator 1214 may not perform the image data merging, and may generate an output image by selecting one of the image data output by each camera module 1100*a*, 1100*b*, and 1100*c*. However, an example embodiment thereof is not limited thereto, and a method of processing the image data may be varied if desired.

In example embodiments, the image generator 1214 may receive a plurality of image data having different exposure times from at least one of the plurality of sub-image processors 1212*a*, 1212*b*, and 1212*c*, and may perform high dynamic range (HDR) processing thereon, such that merged image data with an increased dynamic range may be generated.

The camera module controller 1216 may provide a control signal to each of the camera modules 1100*a*, 1100*b*, and 1100*c*. The control signal generated from the camera module controller 1216 may be provided to corresponding camera modules 1100*a*, 1100*b*, and 1100*c* through control signal lines CSLa, CSLb, and CSLc separated from each other.

One of the plurality of camera modules 1100*a*, 1100*b*, and 1100*c* may be designated as a master camera (e.g., 1100*b*) according to image generating information including a zoom signal, or a mode signal, and the other camera modules (e.g., 1100a and 1100c) may be designated as slave cameras. The above-described information may be included in a control signal and may be provided to corresponding camera modules 1100a, 1100b, and 1100c through control signal lines CSLa, CSLb, and CSLc separated from each other.

Camera modules operating as masters and slaves may change according to a zoom factor or an operation mode signal. For example, when the field of view of the camera module 1100a is wider than that of the camera module 1100b, and the zoom factor exhibits a low zoom ratio, the camera module 1100b may operate as a master, and the camera module 1100a may operate a slave. Alternatively, when the zoom factor exhibits a high zoom ratio, the camera module 1100a may operate as a master and the camera module 1100b may operate as a slave.

In example embodiments, a control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit a sync enable signal to the camera module 1100b. The camera module 1100b receiving the sync enable signal may generate a sync signal on the basis of the provided sync enable signal, and may transmit the generated sync signal to the camera modules 1100a and 1100c. The camera module 1100b and the camera modules 1100a and 1100c may be synchronized with the sync signal and may transmit image data to the application processor 1200.

In example embodiments, a control signal provided from the camera module controller 1216 to the plurality of camera modules 1100a, 1100b, and 1100c may include mode information according to the mode signal. The plurality of camera modules 1100a, 1100b, and 1100c may operate in a first operation mode and a second operation mode in relation to a sensing speed on the basis of the mode information.

In the first operation mode, the plurality of camera modules 1100a, 1100b, and 1100c may generate an image signal at a first rate (e.g., may generate an image signal at a first frame rate), may encode the image signal at a second rate higher than the first rate (e.g., may encode an image signal of a second frame rate higher than a first frame rate), and may transmit the encoded image signal to the application processor 1200. In this case, the second speed may be 30 times or less of the first speed.

The application processor 1200 may store the received image signal, the encoded image signal, in the memory 1230 provided therein or the storage 1400 disposed externally of the application processor 1200, may read out the encoded image signal from the memory 1230 or the storage 1400, and may display image data generated on the basis of the decoded image signal. For example, a corresponding sub-processor among the plurality of sub-image processors 1212a, 1212b, and 1212c of the image processing apparatus 1210 may perform decoding, and may also perform image processing on the decoded image signal.

In the second operation mode, the plurality of camera modules 1100a, 1100b, and 1100c may generate an image signal at a third rate lower than the first rate (e.g., generate an image signal of a third frame rate lower than the first frame rate), and may transmit the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, such as a power voltage, to each of the plurality of camera modules 1100a, 1100b, and 1100c. For example, the PMIC 1300 may supply first power to the camera module 1100a through the power signal line PSLa under control of the application processor 1200, may supply second power to the camera module 1100b through the power signal line PSLb, and may supply third power to the camera module 1100c through the power signal line PSLc.

The PMIC 1300 may generate power corresponding to each of the plurality of camera modules 1100a, 1100b, and 1100c in response to a power control signal PCON from the application processor 1200, and may also adjust a level of power. The power control signal PCON may include a power adjustment signal for each operation mode of the plurality of camera modules 1100a, 1100b, and 1100c. For example, the operation mode may include a low power mode, and in this case, the power control signal PCON may include information on a camera module operating in a low power mode and a determined power level. Levels of power provided to the plurality of camera modules 1100a, 1100b, and 1100c may be the same or different. Also, a level of power may be dynamically changed.

By way of summation and review, an example embodiment of the present disclosure provides an image sensor with controlled doping position and concentration of impurities, so the position and distribution of a potential of a barrier area formed near the doped area may be controlled by an obliquely incident beam during manufacturing of the image sensor. Accordingly, the image sensor may reduce signal saturation by including a selectively formed barrier area, thereby operating with improved performance.

That is, according to the aforementioned example embodiments, the position and concentration of the doped impurities in the image sensor may be adjusted on the basis of an incident angle of the beam incident in the manufacturing process, e.g., by changing the tilt angle during the process, in order to control the maximum dopant implantation depth. By controlling the doping, the position and maximum potential of a barrier area in the image sensor may be adjusted. Accordingly, the barrier area which may control the movement of electric charges between the two photodiodes in each pixel for smooth CIS operation may be formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a substrate including a first surface and a second surface, the first surface and the second surface being spaced apart from each other in a first direction;
pixel regions in the substrate, the pixel regions being arranged in a direction parallel to the first surface;
a first photodiode and a second photodiode in the substrate, the first photodiode and the second photodiode corresponding to each of the pixel regions and being isolated from each other in a second direction perpendicular to the first direction;

a first device isolation film between the pixel regions;

a pair of second device isolation films between the first photodiode and the second photodiode in at least one of the pixel regions, the pair of second device isolation films extending from the first device isolation film to a region between the first photodiode and the second photodiode in a third direction perpendicular to the first direction and the second direction;

a doped layer in the substrate and having portions adjacent to respective second device isolation films of the pair of second device isolation films, the doped layer including impurities and extending in the first direction from the second surface of the substrate to a predetermined depth spaced apart from the first surface of the substrate, and the doped layer being isolated from the first device isolation film in the third direction; and a barrier area between the pair of second device isolation films and between the portions of the doped layer, the barrier area having an electric potential greater than an electric potential of a portion of the substrate adjacent to the barrier area, wherein the barrier area includes the same impurities as the doped layer, which impurities are diffused from the doped layer.

2. The image sensor as claimed in claim 1, wherein: the doped layer includes P-type impurities or N-type impurities, and a concentration of the impurities in the doped layer is greater than a concentration of impurities in an area of the substrate other than the doped layer.

3. The image sensor as claimed in claim 1, wherein a length of the doped layer is smaller than a length of each of the pair of second device isolation films in the first direction.

4. The image sensor as claimed in claim 1, wherein each of the pair of second device isolation films has a length smaller than a length of each of the pixel regions in the second direction.

5. The image sensor as claimed in claim 1, wherein each of the pair of second device isolation films has different lengths in the second direction at two different positions in the third direction.

6. The image sensor as claimed in claim 1, wherein each of the pair of second device isolation films has different lengths in the second direction in at least two different positions in the first direction.

7. A method of manufacturing an image sensor, the method comprising:

obtaining a substrate with pixel regions; forming a first trench that extends in a first direction perpendicular to an upper surface of the substrate, such that the first trench isolates the pixel regions from each other;

forming second trenches in the first direction and connected to the first trench, such that the second trenches are between a first photodiode and a second photodiode corresponding to each of the pixel regions, the first photodiode and the second photodiode being isolated from each other in a second direction perpendicular to the first direction;

implanting impurities into the substrate through the second trenches by irradiating a beam incident on a surface of the substrate perpendicular to the second direction at a predetermined angle with the first direction, based on a predetermined depth to which impurities are implanted into the substrate in the first direction; and after implanting the impurities, forming a first device isolation film in the first trench and forming a second device isolation film in the second trenches.

8. The method as claimed in claim 7, further comprising forming a mask layer including a photosensitive polymer material on the substrate, before implanting the impurities into the substrate.

9. The method as claimed in claim 7, wherein a concentration of the impurities implanted into the substrate is controlled based on the predetermined angle.

10. The method as claimed in claim 7, wherein the second device isolation film includes a pair of device isolation films extending from the first device isolation film into each of the pixel regions in a third direction perpendicular to the first direction and the second direction.

11. The method as claimed in claim 7, wherein the second device isolation film extends to penetrate each of the pixel regions in a third direction perpendicular to the first direction and the second direction.

12. The method as claimed in claim 7, wherein implanting the impurities by irradiating the beam includes increasing the predetermined angle of the beam to increase the predetermined depth.

13. The method as claimed in claim 7, wherein the second trenches are disposed between the first photodiode and the second photodiode in the first direction, the second trenches having a predetermined length in a third direction perpendicular to the first direction and the second direction.

14. The method as claimed in claim 13, wherein the predetermined length in the third direction of the second trenches increases with an increase of the predetermined depth.

15. The method as claimed in claim 13, wherein implanting the impurities into the substrate includes controlling a concentration of the impurities implanted into the substrate based on the predetermined angle and the predetermined length.

16. The method as claimed in claim 7, wherein implanting the impurities by irradiating the beam includes adjusting an angle of the beam to be incident in a direction of an internal area of each of the pixel regions.

17. The method as claimed in claim 7, wherein the impurities are implanted at a first depth of the substrate in a region adjacent to the first trench and are implanted at a second depth of the substrate in a region adjacent to the second trenches, the first depth being less than the second depth.

18. The method as claimed in claim 7, wherein the impurities are implanted to have a first concentration in a region of the substrate adjacent to the first trench, and are implanted to have a second concentration in a region of the substrate adjacent to the second trenches, the first concentration being less than the second concentration.

19. A method of manufacturing an image sensor, the method comprising:

forming first trenches in a first direction perpendicular to an upper surface of a substrate, such that the first trenches isolate pixel regions from each other;

forming second trenches connected to the first trenches, such that the second trenches extend in the first direction between a first photodiode and a second photodiode according to each of the pixel regions, the first photodiode and the second photodiode being isolated from each other in a second direction perpendicular to the first direction;

implanting impurities into the substrate through the second trenches using a beam incident perpendicularly to the second direction at a predetermined angle with the first direction so as to intersect with the first direction; and forming a barrier area in the substrate between the first photodiode and the second photodiode, such that a position of the barrier area and a maximum electric potential of the barrier area are determined by the predetermined angle.

20. The method as claimed in claim 19, wherein a distribution of the electric potential of the barrier area corresponding to the predetermined angle is determined by a shape of the second trenches.

* * * * *